(12) United States Patent
Shin et al.

(10) Patent No.: US 12,389,558 B2
(45) Date of Patent: Aug. 12, 2025

(54) HINGE APPARATUS INCLUDING CAM STRUCTURE AND ELECTRONIC DEVICE INCLUDING THE SAME

(71) Applicant: SAMSUNG ELECTRONICS CO., LTD., Suwon-si (KR)

(72) Inventors: Wonho Shin, Suwon-si (KR); Junghoon Park, Suwon-si (KR); Joongkyung Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 144 days.

(21) Appl. No.: 17/851,518

(22) Filed: Jun. 28, 2022

(65) Prior Publication Data

US 2022/0400565 A1    Dec. 15, 2022

Related U.S. Application Data

(63) Continuation of application No. PCT/KR2022/007841, filed on Jun. 2, 2022.

(30) Foreign Application Priority Data

Jun. 9, 2021  (KR) .......................... 10-2021-0074676

(51) Int. Cl.
  *H05K 5/02*    (2006.01)
  *F16C 11/04*   (2006.01)
  (Continued)

(52) U.S. Cl.
  CPC ............ *H05K 5/0226* (2013.01); *F16C 11/04* (2013.01); *H05K 5/0018* (2022.08); *E05D 3/122* (2013.01);
  (Continued)

(58) Field of Classification Search
  CPC ....... H05K 5/0226; F16C 11/04; E05D 3/122; E05Y 2201/638; G06F 1/1681
  See application file for complete search history.

(56) References Cited

U.S. PATENT DOCUMENTS 7,818,845 B2 * 10/2010 Hu ...................... H04M 1/0216
                                                              16/303
10,274,997 B2 * 4/2019 Lin ..................... H04M 1/0268
                    (Continued)

FOREIGN PATENT DOCUMENTS

CN      210986138       7/2020
CN      112762090       5/2021
                    (Continued)

OTHER PUBLICATIONS

Search Report and Written Opinion dated Jun. 27, 2022 issued in International Patent Application No. PCT/KR2022/007841.
(Continued)

*Primary Examiner* — Rockshana D Chowdhury
*Assistant Examiner* — Douglas R Burtner
(74) *Attorney, Agent, or Firm* — Nixon & Vanderhye P.C.

(57) ABSTRACT

A hinge apparatus according to various embodiments may include: a bracket including a first coupling part formed in a first direction with respect to a middle of the bracket and a second coupling part formed in a second direction opposite to the first direction with respect to the middle of the bracket, a first body part including a first plate, a first rotation part coupled with the first plate fastened to the first coupling part of the bracket and configured to rotate about the bracket, and a first cam formed in the first rotation part, a second body part including a second plate, a second rotation part coupled with the second plate fastened to the second coupling part of the bracket and configured to rotate about the bracket, and a second cam formed in the second rotation part, and a torque provision unit, including a first follower including a (Continued)

first cam part engaged with the first cam structure and disposed in the bracket, a second follower including a second cam part engaged with the second cam structure and disposed in the bracket, and a pressurizing part disposed in the bracket between the first follower and the second follower and configured to provide an elastic force to the first follower and the second follower in opposite directions.

7 Claims, 20 Drawing Sheets

(51) Int. Cl.
   *H05K 5/00* (2006.01)
   *E05D 3/12* (2006.01)
(52) U.S. Cl.
   CPC ... *E05Y 2201/638* (2013.01); *E05Y 2201/716* (2013.01); *E05Y 2999/00* (2024.05)

(56) References Cited

U.S. PATENT DOCUMENTS

| | | | |
|---|---|---|---|
| 10,545,538 B2* | 1/2020 | Jia | H04M 1/0268 |
| 10,845,850 B1 | 11/2020 | Kang et al. | |
| 11,023,009 B2* | 6/2021 | Kim | G06F 1/1681 |
| 11,231,752 B2 | 1/2022 | Liu | |
| 11,231,754 B2 | 1/2022 | Kang et al. | |
| 11,395,424 B2* | 7/2022 | Nagai | G06F 1/1652 |
| 11,516,932 B2* | 11/2022 | Sim | H05K 5/0017 |
| 11,579,658 B2* | 2/2023 | Kim | G06F 1/1626 |
| 11,599,156 B2* | 3/2023 | Kim | G06F 1/1641 |
| 11,678,449 B2* | 6/2023 | Lee | G06F 3/0488 |
| | | | 361/807 |
| 12,041,193 B2* | 7/2024 | Cha | H04M 1/0247 |
| 2014/0009877 A1* | 1/2014 | Okamoto | G06F 1/1681 |
| | | | 361/679.01 |
| 2015/0362958 A1* | 12/2015 | Shang | E05D 3/122 |
| | | | 16/334 |
| 2016/0090763 A1* | 3/2016 | Hsu | E05D 3/122 |
| | | | 16/354 |
| 2017/0328102 A1 | 11/2017 | Kato | |
| 2018/0059740 A1* | 3/2018 | Kato | E05D 3/06 |
| 2020/0348732 A1* | 11/2020 | Kang | G06F 1/1652 |
| 2020/0383220 A1 | 12/2020 | Kang et al. | |
| 2022/0261040 A1* | 8/2022 | Liu | G06F 1/1679 |
| 2022/0408580 A1* | 12/2022 | Shin | H05K 5/0226 |
| 2023/0044949 A1* | 2/2023 | Park | H05K 5/0226 |
| 2023/0044990 A1* | 2/2023 | Park | F16C 11/045 |
| 2023/0076291 A1* | 3/2023 | Yun | F16C 11/04 |
| 2023/0107816 A1* | 4/2023 | Yoo | G06F 1/1681 |
| | | | 361/679.01 |
| 2023/0213983 A1* | 7/2023 | Yun | H04M 1/022 |
| | | | 361/679.27 |
| 2024/0040725 A1* | 2/2024 | Wang | G06F 1/1681 |
| 2024/0090147 A1* | 3/2024 | Feng | G06F 1/1616 |
| 2024/0430348 A1* | 12/2024 | Park | F16C 11/045 |

FOREIGN PATENT DOCUMENTS

| | | |
|---|---|---|
| CN | 213176454 | 5/2021 |
| CN | 112911033 | 6/2021 |
| KR | 10-1113712 B1 | 2/2012 |
| KR | 10-2020-0126524 | 11/2020 |
| KR | 10-2020-0138948 A | 12/2020 |

OTHER PUBLICATIONS

Extended European Search Report dated Aug. 26, 2024 for EP Application No. 22820477.2.
Korean Notice of Allowance dated Jun. 10, 2025 for KR Application No. 10-2021-0074676.

* cited by examiner

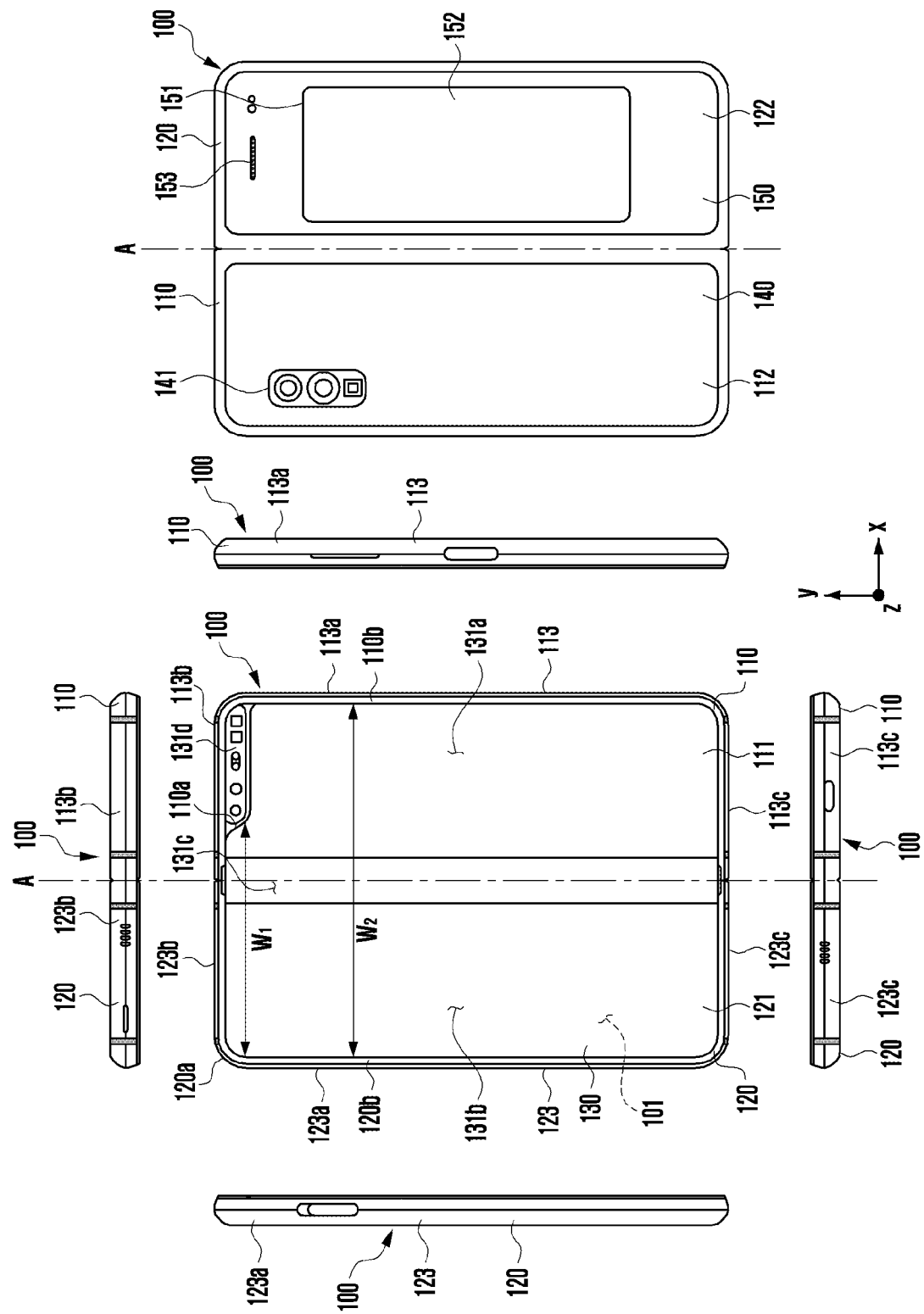

(A)

(B)

(A)

(B)

(A)

(B)

HINGE APPARATUS INCLUDING CAM STRUCTURE AND ELECTRONIC DEVICE INCLUDING THE SAME

CROSS-REFERENCE TO RELATED APPLICATIONS

This application is a continuation of International Application No. PCT/KR2022/007841 designating the United States, filed on Jun. 2, 2022, in the Korean Intellectual Property Receiving Office and claiming priority to Korean Patent Application No. 10-2021-0074676, filed on Jun. 9, 2021, in the Korean Intellectual Property Office, the disclosures of which are incorporated by reference herein in their entireties.

BACKGROUND

Field

The disclosure relates to a hinge apparatus including a cam structure and an electronic device including the hinge apparatus.

Description of Related Art

A hinge apparatus is widely used in the industry as a structure for rotatably connecting an instrument. For example, a hinge structure may be applied to a foldable electronic device.

With the development of a technology for an element included in an electronic device, electronic devices having various forms are being developed. In particular, as a foldable display is developed with the development of a technology for a display visually displaying information, an electronic device having a new concept is emerging.

For example, a foldable electronic device may be implemented by applying a foldable display. As an electronic device having such a new form factor emerges, the need for the development of a technology for an element that rotatably connects a housing of the electronic device is gradually increasing.

In order to increase usability in a folding process of a foldable electronic device, a pause operation and a free stop operation may be necessary. The pause operation may refer to an operation of an electronic device maintaining a corresponding state in the state in which the electronic device has been fully folded or the state in which the electronic device has been fully unfolded. The free stop operation may refer to an operation of an electronic device maintaining a corresponding state when an external force or higher is not applied to the electronic device in a process of the electronic device changing from a folding state to an unfolding state.

In the case of a portable electronic device, it is important to implement the portable electronic device in a compact size. A hinge apparatus included in the electronic device needs to be compactly designed.

SUMMARY

Embodiments of the disclosure may provide a hinge apparatus constructed as a relatively simple structure and implemented in a compact size and capable of implementing a pause operation and free stop operation of an electronic device and an electronic device including the same.

A hinge apparatus according to various example embodiments of the disclosure may include: a bracket including a first coupling part formed in a first direction with respect to the middle of the bracket and a second coupling part formed in a second direction opposite to the first direction with respect to the middle of the bracket, a first body part including a first plate, a first rotation part coupled with the first plate fastened to the first coupling part of the bracket and configured to rotate about the bracket, and a first cam formed in the first rotation part, a second body part including a second plate, a second rotation part coupled with the second plate fastened to the second coupling part of the bracket and configured to rotate about the bracket, and a second cam formed in the second rotation part, and a torque provision unit, including a first follower including a first cam part engaged with the first cam and disposed in the bracket, a second follower including a second cam part engaged with the second cam and disposed in the bracket, and a pressurizing member disposed in the bracket between the first follower and the second follower and configured to provide an elastic force to the first follower and the second follower in opposite directions.

An electronic device according to various example embodiments of the disclosure may include: a display, a first housing, a second housing, and a hinge rotatably connecting the first housing and the second housing. The hinge may include: a bracket including a first coupling part formed in a first direction with respect to a middle of the bracket and a second coupling part formed in a second direction opposite to the first direction with respect to the middle of the bracket, a first body part including a first plate, a first rotation part coupled with the first plate fastened to the first coupling part of the bracket and configured to rotate about the bracket, and a first cam formed in the first rotation part, a second body part including a second plate, a second rotation part coupled with the second plate fastened to the second coupling part of the bracket and configured to rotate about the bracket, and a second cam formed in the second rotation part, and a torque provision unit, including a first follower including a first cam part engaged with the first cam structure and disposed in the bracket, a second follower including a second cam part engaged with the second cam structure and disposed in the bracket, and a pressurizing member disposed in the bracket between the first follower and the second follower and configured to provide an elastic force the first follower and the second follower in opposite directions.

According to various example embodiments of the disclosure, a loss of torque which may occur in a process of delivering the torque can be reduced because the hinge apparatus having the structure capable of directly providing the torque to a part where the electronic device is rotated is used. An overall size of an electronic device can be compactly designed because the hinge apparatus can be implemented in a relatively compact size. The assembly productivity of the hinge apparatus can be improved, and a unit cost can be reduced.

BRIEF DESCRIPTION OF THE DRAWINGS

In relation to the description of the drawings, the same or similar reference numerals may be used with respect to the same or similar elements. Further, the above and other aspects, features and advantages of certain embodiments of the present disclosure will be more apparent from the following detailed description, taken in conjunction with the accompanying drawings, in which:

FIG. 1A is a diagram illustrating an unfolding state of a foldable electronic device according to various embodiments;

DETAILED DESCRIPTION

Figure 1B:
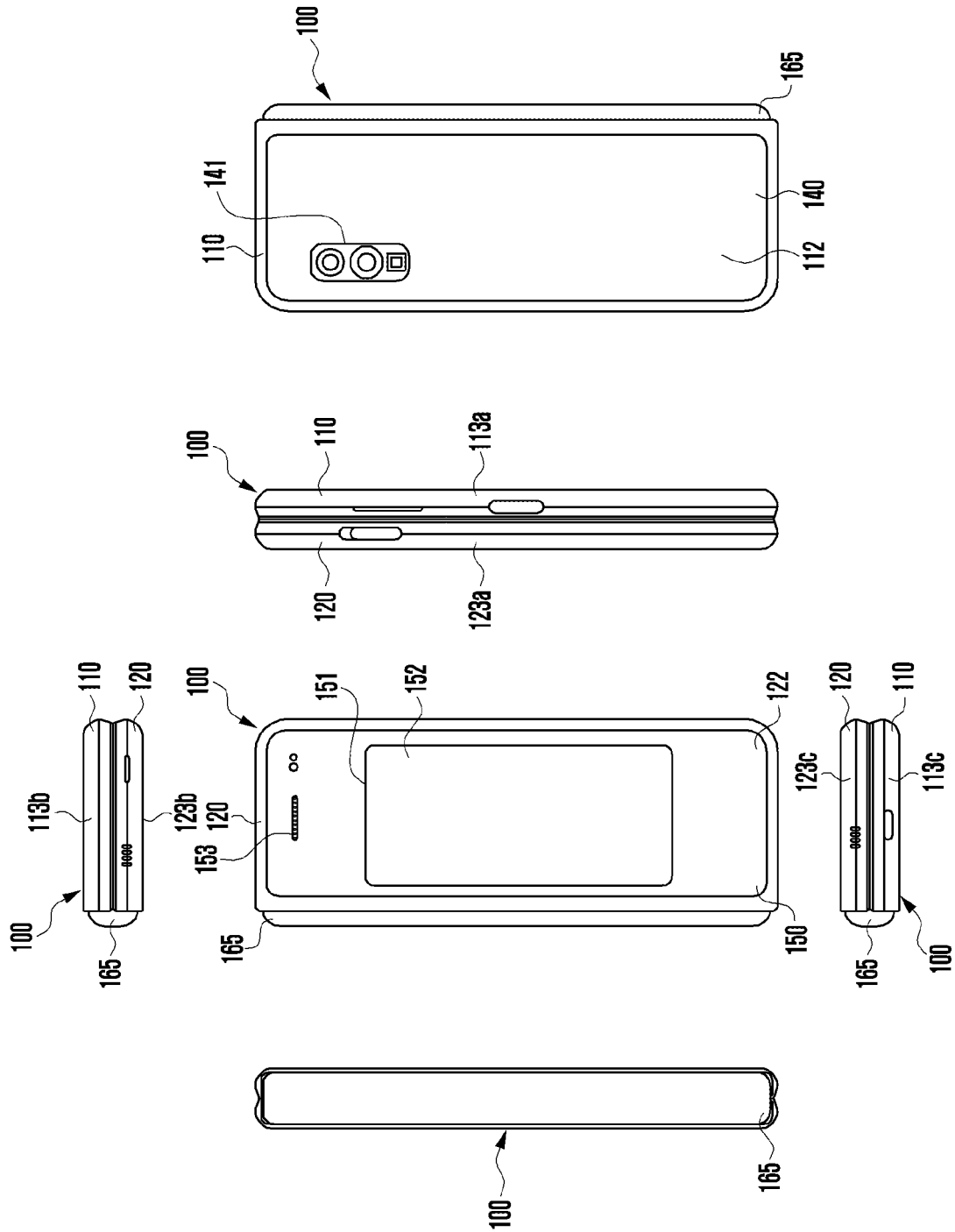
FIG. 1B is a diagram illustrating a folding state of the foldable electronic device in FIG. 1A according to various embodiments.

It should be appreciated that various example embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1A is a diagram illustrating an unfolded state of a foldable electronic device according to various embodiments. FIG. 1B is a diagram illustrating a folded state of the foldable electronic device of FIG. 1A according to various embodiments.

Referring to FIG. 1A, an electronic device 100 may include a pair of housing structures 110 and 120 rotatably coupled via a hinge structure (e.g., hinge structure 164 in FIG. 1C) to be folded relative to each other, a hinge cover 165 covering the foldable portion of the pair of housing structures 110 and 120, and a display 130 (e.g., flexible display or foldable display) disposed in the space formed by the pair of housing structures 110 and 120.

In the description, the surface on which the display 130 is disposed may be referred to as the front surface of the electronic device 100, and the opposite side of the front surface may be referred to as the rear surface of the electronic device 100.

The surface surrounding the space between the front surface and the rear surface may be referred to as the side surface of the electronic device 100.

In the description, a facing direction of the front surface may be referred to as a first direction, and a facing direction of the rear surface may be referred to as a second direction.

In the description, regards to explanation to an order of layer (e.g., the layer order of the display), "B layer formed on A layer" may refer to B layer formed in the first direction to A layer. Or "B layer formed below A layer" may refer to B layer formed in the second direction to A layer.

In an embodiment, the pair of housing structures 110 and 120 may include a first housing structure 110 including a sensor region 131d, a second housing structure 120, a first rear cover 140, and a second rear cover 150. The pair of housing structures 110 and 120 of the electronic device 100 are not limited to the shape or combination illustrated in FIGS. 1 and 2, but may be implemented in various shapes or combinations. For example, in another embodiment, the first housing structure 110 and the first rear cover 140 may be formed as a single body, and the second housing structure 120 and the second rear cover 150 may be formed as a single body.

In an embodiment, the first housing structure 110 and the second housing structure 120 may be disposed at both sides with respect to the folding axis (A) and may be substantially symmetrical with respect to the folding axis (A). In an embodiment, the angle or distance between the first housing structure 110 and the second housing structure 120 may vary depending upon whether the electronic device 100 is in the flat state or closed state, the folded state, or the intermediate state. In an embodiment, the first housing structure 110 includes the sensor region 131d where various sensors are disposed, but may have a symmetrical shape with the second housing structure 120 in other regions. In another embodiment, the sensor region 131d may be disposed in a specific region of the second housing structure 120 or may be replaced.

In an embodiment, during the flat state of the electronic device 100, the first housing structure 110 may be connected to the hinge structure (e.g., hinge structure 164 in FIG. 1C), and may include a first surface 111 facing the front surface of the electronic device 100, a second surface 112 facing away from the first surface 111, and a first side member 113 enclosing at least a portion of the space between the first surface 111 and the second surface 112. In an embodiment, the first side member 113 may include a first side surface 113a disposed in parallel with the folding axis (A), a second side surface 113b extending from one end of the first side surface 113*a* in a direction perpendicular to the folding axis, and a third side surface 113*c* extending from the other end of the first side surface 113*a* in a direction perpendicular to the folding axis.

In an embodiment, during the flat state of the electronic device 100, the second housing structure 120 may be connected to the hinge structure (e.g., hinge structure 164 in FIG. 1C), and may include a third surface 121 facing the front surface of the electronic device 100, a fourth surface 122 facing away from the third surface 121, and a second side member 123 enclosing at least a portion of the space between the third surface 121 and the fourth surface 122. In an embodiment, the second side member 123 may include a fourth side surface 123*a* disposed in parallel with the folding axis (A), a fifth side surface 123*b* extending from one end of the fourth side surface 123*a* in a direction perpendicular to the folding axis, and a sixth side surface 123*c* extending from the other end of the fourth side surface 123*a* in a direction perpendicular to the folding axis. In an embodiment, the third surface 121 may face the first surface 111 in the folded state.

In an embodiment, the electronic device 100 may include a recess 101 formed to accommodate the display 130 through a structural combination of the shapes of the first housing structure 110 and the second housing structure 120. The recess 101 may have substantially the same size as the display 130. In an embodiment, the recess 101 may have two or more different widths in a direction perpendicular to the folding axis (A) due to the sensor region 131*d*. For example, the recess 101 may have a first width (W1) between a first portion 120*a* of the second housing structure 120 parallel to the folding axis (A) and a first portion 110*a* of the first housing structure 110 formed at the edge of the sensor region 131*d*, and have a second width (W2) between a second portion 120*b* of the second housing structure 120 and a second portion 110*b* of the first housing structure 110 that does not correspond to the sensor region 113*d* and is parallel to the folding axis (A). Here, the second width (W2) may be wider than the first width (W1). In other words, the recess 101 may be formed to have the first width (W1) ranging from the first portion 110*a* of the first housing structure 110 to the first portion 120*a* of the second housing structure 120 (asymmetric shape), and the second width (W2) ranging from the second portion 110*b* of the first housing structure 110 to the second portion 120*b* of the second housing structure 120 (symmetric shape). In an embodiment, the first portion 110*a* and the second portion 110*b* of the first housing structure 110 may be located at different distances from the folding axis (A). The width of the recess 101 is not limited to the example shown above. In various embodiments, the recess 101 may have two or more different widths owing to the shape of the sensor region 113*d* or the asymmetry of the first housing structure 110 or the second housing structure 120.

In an embodiment, at least a portion of the first housing structure 110 and the second housing structure 120 may be made of a metal or non-metal material having a rigidity value selected to support the display 130.

In an embodiment, the sensor region 131*d* may be formed to have a preset area near to one corner of the first housing structure 110. However, the arrangement, shape, or size of the sensor region 131*d* is not limited to the illustrated example. For example, in a certain embodiment, the sensor region 131*d* may be formed at another corner of the first housing structure 110 or in any region between the upper corner and the lower corner. In another embodiment, the sensor region 131*d* may be disposed at a portion of the second housing structure 120. In another embodiment, the sensor region 131*d* may be formed to extend between the first housing structure 110 and the second housing structure 120. In an embodiment, to perform various functions, the electronic device 100 may include components exposed to the front surface of the electronic device 100 through the sensor region 113*d* or through one or more openings provided in the sensor region 131*d*. The components may include, for example, at least one of a front camera, a receiver, a proximity sensor, an illuminance sensor, an iris recognition sensor, an ultrasonic sensor, or an indicator.

In an embodiment, the first rear cover 140 may be disposed on the second surface 112 of the first housing structure 110 and may have a substantially rectangular periphery. In an embodiment, at least a portion of the periphery may be wrapped by the first housing structure 110. Similarly, the second rear cover 150 may be disposed on the fourth surface 122 of the second housing structure 120, and at least a portion of the periphery thereof may be wrapped by the second housing structure 120.

In the illustrated embodiment, the first rear cover 140 and the second rear cover 150 may have a substantially symmetrical shape with respect to the folding axis (A). In another embodiment, the first rear cover 140 and the second rear cover 150 may have various different shapes. In another embodiment, the first rear cover 140 may be formed as a single body with the first housing structure 110, and the second rear cover 150 may be formed as a single body with the second housing structure 120.

In an embodiment, the first rear cover 140, the second rear cover 150, the first housing structure 110, and the second housing structure 120 may be combined with each other so as to provide a space where various components (e.g., printed circuit board, antenna module, sensor module, and battery) of the electronic device 100 can be arranged. In an embodiment, one or more components may be disposed on or visually exposed via the rear surface of the electronic device 100. For example, one or more components or sensors may be visually exposed through the first rear region 141 of the first rear cover 140. The sensors may include a proximity sensor, a rear camera, and/or a flash. In another embodiment, at least a portion of the sub-display 152 may be visually exposed through the second rear region 151 of the second rear cover 150.

The display 130 may be disposed on the space formed by the pair of housing structures 110 and 120. For example, the display 130 may be seated in the recess (e.g., recess 101 in FIG. 1A) formed by the pair of housing structures 110 and 120, and may be disposed to substantially occupy most of the front surface of the electronic device 100. Hence, the front surface of the electronic device 100 may include the display 130, a portion (e.g., edge region) of the first housing structure 110 close to the display 130, and a portion (e.g. edge region) of the second housing structure 120 close to the display 130. In an embodiment, the rear surface of the electronic device 100 may include the first rear cover 140, a portion (e.g., edge region) of the first housing structure 110 close to the first rear cover 140, the second rear cover 150, and a portion (e.g. edge region) of the second housing structure 120 close to the second rear cover 150.

In an embodiment, the display 130 may refer to a display in which at least a portion may be deformed into a flat or curved surface. In an embodiment, the display 130 may include a folding region 131*c*, a first region 131*a* disposed on one side (e.g., right side of the folding region 131*c*) with respect to the folding region 131*c*, and a second region 131*b* disposed on the other side (e.g., left side of the folding region 131c). For example, the first region 131a may be disposed on the first surface 111 of the first housing structure 110, and the second region 131b may be disposed on the third surface 121 of the second housing structure 120. This demarcation of the display 130 is only an example, and the display 130 may be subdivided into plural regions (e.g., four or more regions) according to the structure or functionality. For example, in the embodiment of FIG. 1A, the area of the display 130 may be subdivided with respect to the folding region 131c or the folding axis (A) extending parallel to the y-axis. However, in another embodiment, the area of the display 130 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 110 and 120 and the hinge structure (e.g., hinge structure 164 in FIG. 1C), and the display 130 may substantially present one full screen through the pair of housing structures 110 and 120 and the hinge structure (e.g., hinge structure 164 in FIG. 1C). In an embodiment, the first region 131a and the second region 131b may have a symmetrical shape with respect to the folding region 131c. Although the first region 131a may include a notch region (e.g., notch region 133 in FIG. 1C) cut according to the presence of the sensor region 131d, the first region 131a may have a symmetrical shape with the second region 131b in other portions. In other words, the first region 131a and the second region 131b may include portions with symmetrical shapes and portions with asymmetrical shapes.

FIG. 1B is a diagram illustrating a folded state of the electronic device of FIG. 1A according to an embodiment of the disclosure.

Figure 1C:
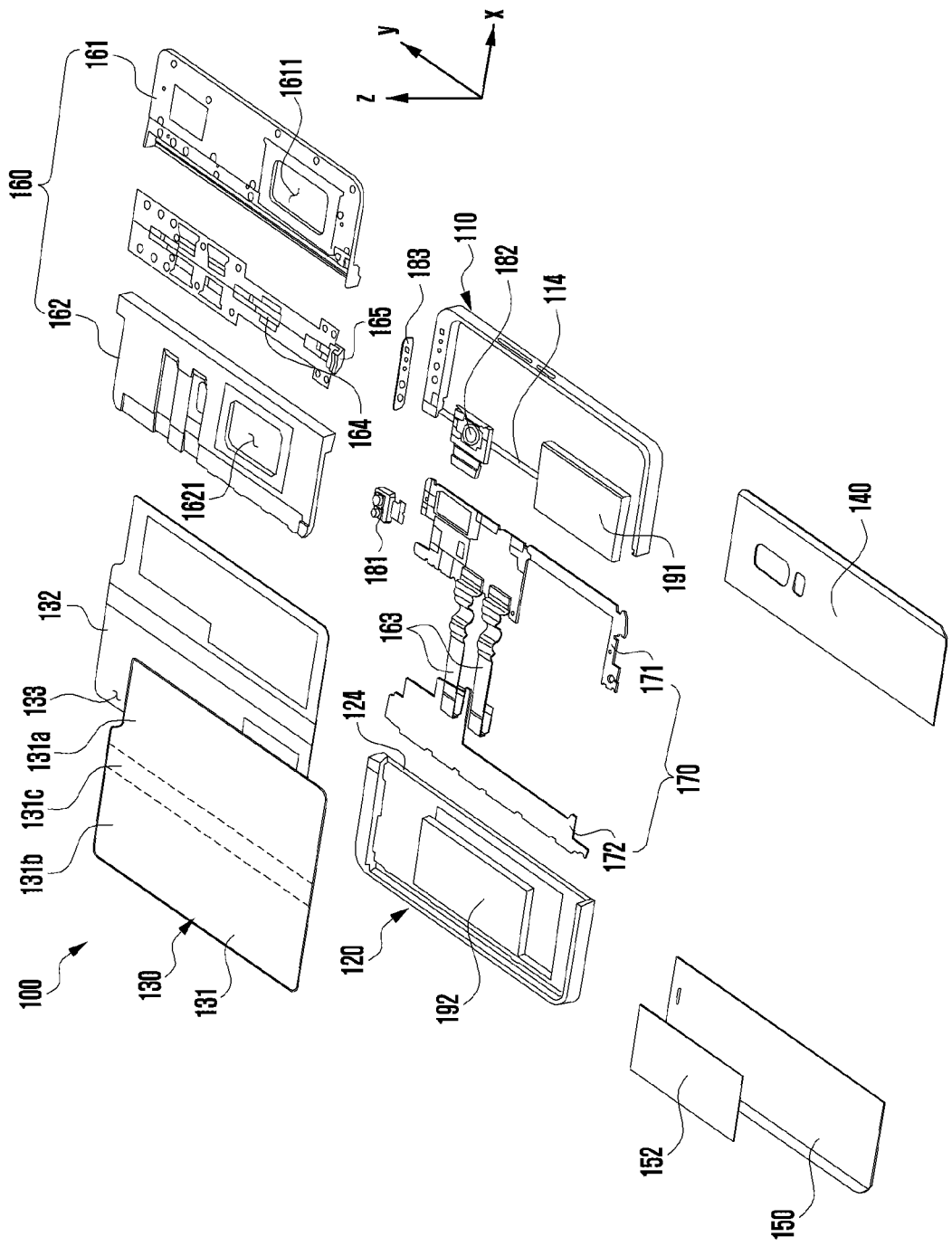
FIG. 1C is an exploded perspective view of the electronic device according to various embodiments.

Referring to FIG. 1B, the hinge cover 165 may be disposed between the first housing structure 110 and the second housing structure 120 so as to cover the internal components (e.g., hinge structure 164 in FIG. 1C). In an embodiment, the hinge cover 165 may be covered by portions of the first housing structure 110 and the second housing structure 120 or be exposed to the outside according to the operating state (e.g., flat state or folded state) of the electronic device 100.

For example, when the electronic device 100 is in the flat state as illustrated in FIG. 1A, the hinge cover 165 may be covered by the first housing structure 110 and the second housing structure 120 so as not to be exposed. When the electronic device 100 is in the folded state (e.g., completely folded state) as illustrated in FIG. 1B, the hinge cover 165 may be exposed to the outside between the first housing structure 110 and the second housing structure 120. When the electronic device 100 is in the intermediate state where the first housing structure 110 and the second housing structure 120 make a certain angle, the hinge cover 165 may be partially exposed to the outside between the first housing structure 110 and the second housing structure 120. In this case, the exposed portion may be less than that for the fully folded state. In an embodiment, the hinge cover 165 may include a curved surface.

Next, a description is given of configurations of the first housing structure 110 and the second housing structure 120 and regions of the display 130 according to the operating state (e.g. flat state or folded state) of the electronic device 100.

In an embodiment, when the electronic device 100 is in the flat state (e.g., state of FIG. 1A), the first housing structure 110 and the second housing structure 120 may make an angle of 180 degrees, and the first region 131a and the second region 131b of the display may be disposed to face in the same direction. In addition, the folding region 131c may be coplanar with the first region 131a and the second region 131b.

In an embodiment, when the electronic device 100 is in the folded state (e.g., state of FIG. 1B), the first housing structure 110 and the second housing structure 120 may be disposed to face each other. The first region 131a and the second region 131b of the display 130 may face each other, making a narrow angle (e.g., between 0 degrees and 10 degrees). At least a portion of the folding region 131c may form a curved surface with a preset curvature.

In an embodiment, when the electronic device 100 is in the intermediate state, the first housing structure 110 and the second housing structure 120 may be disposed to make a certain angle. The first region 131a and the second region 131b of the display 130 may form an angle greater than that for the folded state and less than that for the flat state. At least a portion of the folding region 131c may form a curved surface with a preset curvature. This curvature may be less than that for the folded state.

FIG. 1C is an exploded perspective view of an electronic device according to various embodiments.

Referring to FIG. 1C, in an embodiment, the electronic device 100 may include a display 130, a support member assembly 160, at least one printed circuit board 170, a first housing structure 110, a second housing structure 120, a first rear cover 140, and a second rear cover 150. In the description, the display 130 may be referred to as a display unit, display module, or display assembly.

The display 130 may include a display panel 131 (e.g., flexible display panel), and at least one plate 132 or layer on which the display panel 131 is seated. In an embodiment, one or more plates 132 may include a conductive plate (e.g., Cu sheet or SUS sheet) disposed between the display panel 131 and the support member assembly 160. According to an embodiment, the conductive plate may be formed to have substantially the same area as that of the display, and an area facing a folding area of the display may be formed to be bendable. The plate 132 may include at least one subsidiary material layer (e.g., graphite member) disposed at a rear surface of the display panel 131. In an embodiment, the plate 132 may be formed in a shape corresponding to the display panel 131. For example, a partial area of the first plate 132 may be formed in a shape corresponding to the notch area 133 of the display panel 131.

The support member assembly 160 may include a first support member 161, a second support member 162, a hinge structure 164 disposed between the first support member 161 and the second support member 162, a hinge cover 165 to cover the hinge structure 164 when viewed from the outside, and a wiring member 163 (e.g., flexible printed circuit board (FPCB)) that crosses the first support member 161 and the second support member 162.

In an embodiment, the support member assembly 160 may be disposed between the plate 132 and at least one printed circuit board 170. For example, the first support member 161 may be disposed between the first region 131a of the display 130 and the first printed circuit board 171. The second support member 162 may be disposed between the second region 131b of the display 130 and the second printed circuit board 172.

In an embodiment, at least a portion of the wiring member 163 and the hinge structure 164 may be disposed within the support member assembly 160. The wiring member 163 may be disposed in a direction crossing the first support member 161 and the second support member 162 (e.g., x-axis direction). The wiring member 163 may be disposed in a direction (e.g., x-axis direction) perpendicular to the folding axis (e.g., y-axis or folding axis (A) in FIG. 1B) of the folding region 131c.

The at least one printed circuit board 170 may include, as described above, the first printed circuit board 171 disposed on the side of the first support member 161, and the second printed circuit board 172 disposed on the side of the second support member 162. The first printed circuit board 171 and the second printed circuit board 172 may be disposed inside the space formed by the support member assembly 160, the first housing structure 110, the second housing structure 120, the first rear cover 140, and the second rear cover 150. Various components for implementing functions of the electronic device 100 may be mounted on the first printed circuit board 171 and the second printed circuit board 172.

In an embodiment, a first space of the first housing structure 110 may include a first printed circuit board 171 disposed in a space formed through the first support member 161, a first battery 191 disposed at a position facing a first swelling hole 1611 of the first support member 161, at least one sensor module 181, or at least one camera module 182. The first housing structure 110 may include a window glass 183 disposed to protect at least one sensor module 181 and at least one camera module 182 at a position corresponding to the notch area 133 of the display 130. In an embodiment, the second space of the second housing structure 120 may include a second printed circuit board 172 disposed in a second space formed through the second support member 162 and a second battery 192 disposed at a position facing the second swelling hole 1621 of the second support member 162. According to an embodiment, the first housing structure 110 and the first support member 161 may be integrally formed. According to an embodiment, the second housing structure 120 and the second support member 162 may also be integrally formed. According to an embodiment, a sub display 152 may be disposed in the second space of the second housing structure 120. According to an embodiment, the sub display 152 (e.g., the second display) may be disposed to be visible from the outside through at least a partial area of the second rear cover 150.

In an embodiment, the first housing structure 110 may include a first rotary support surface 114, and the second housing structure 120 may include a second rotary support surface 124 corresponding to the first rotary support surface 114. The first rotary support surface 114 and the second rotary support surface 124 may include a curved surface corresponding to the curved surface included in the hinge cover 165.

In an embodiment, when the electronic device 100 is in the flat state (e.g., state of FIG. 1A), the first rotary support surface 114 and the second rotary support surface 124 may cover the hinge cover 165 so that the hinge cover 165 may be not or minimally exposed to the rear surface of the electronic device 100. When the electronic device 100 is in the folded state (e.g., state of FIG. 1B), the first rotary support surface 114 and the second rotary support surface 124 may rotate along the curved surface included in the hinge cover 165 so that the hinge cover 165 may be maximally exposed to the rear surface of the electronic device 100.

Figure 2A:
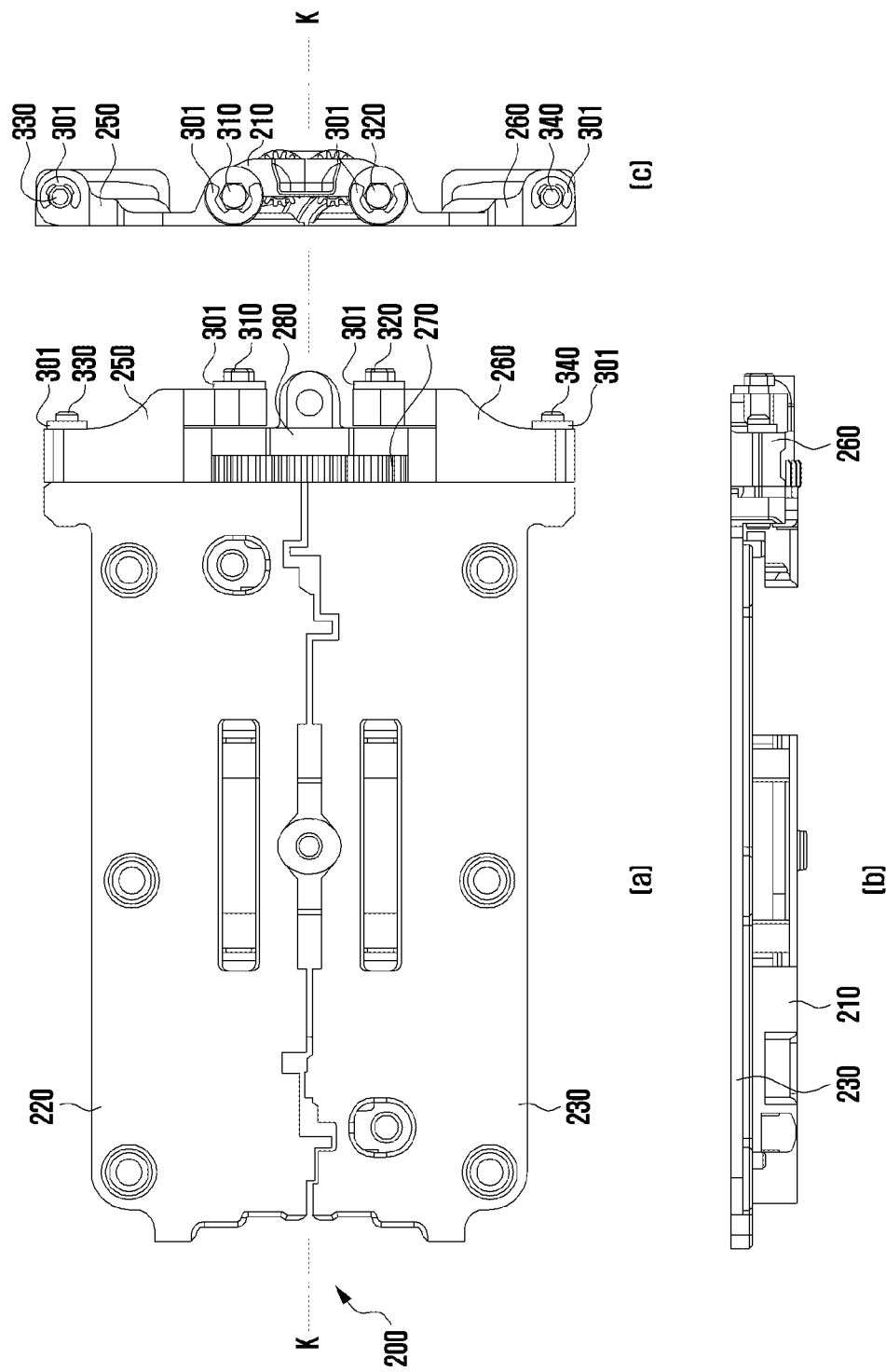
FIG. 2A is a front view and side view of a hinge apparatus according to various embodiments.
Figure 2B:
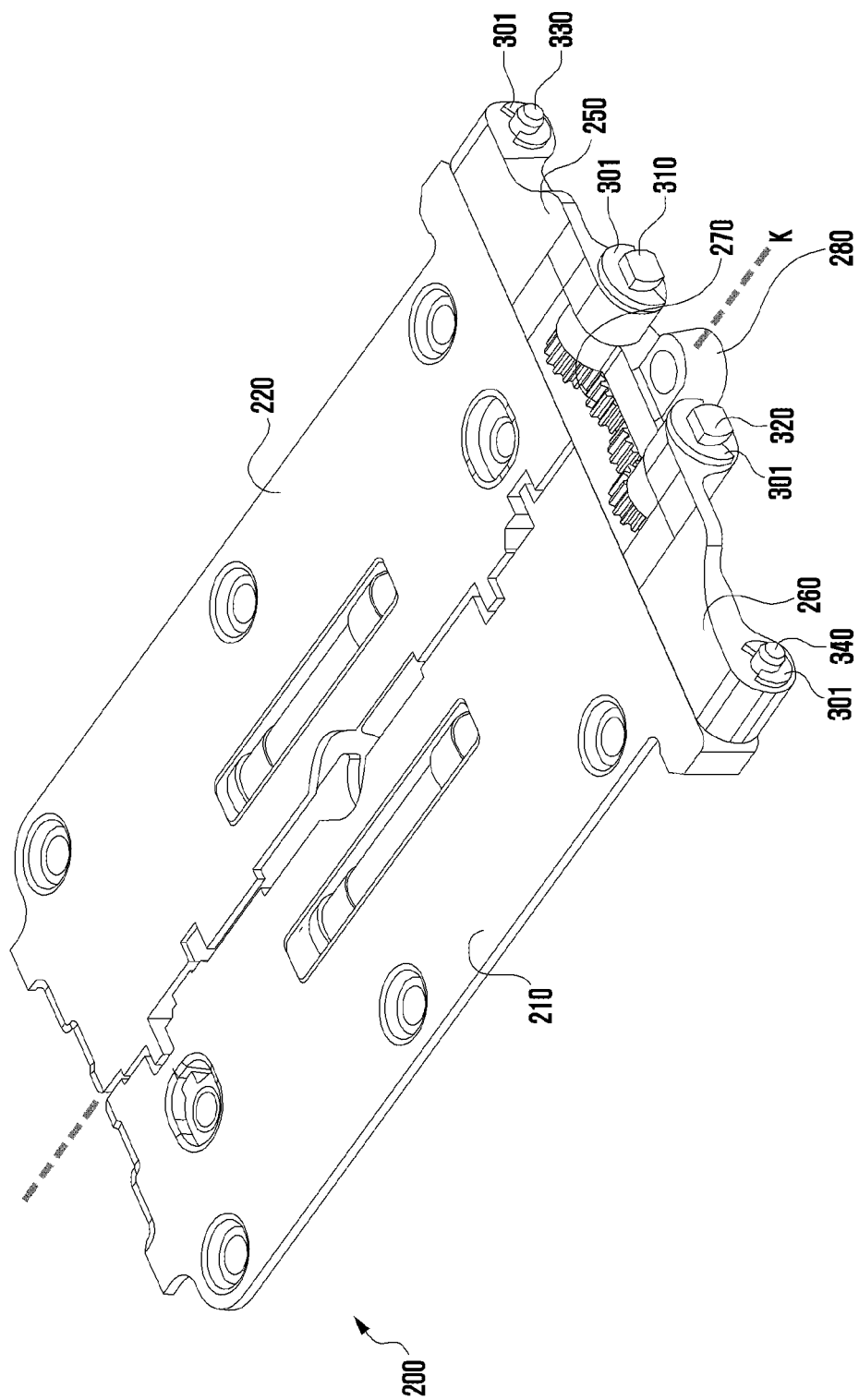
FIG. 2B is a perspective view of the hinge apparatus according to various embodiments.
Figure 2C:
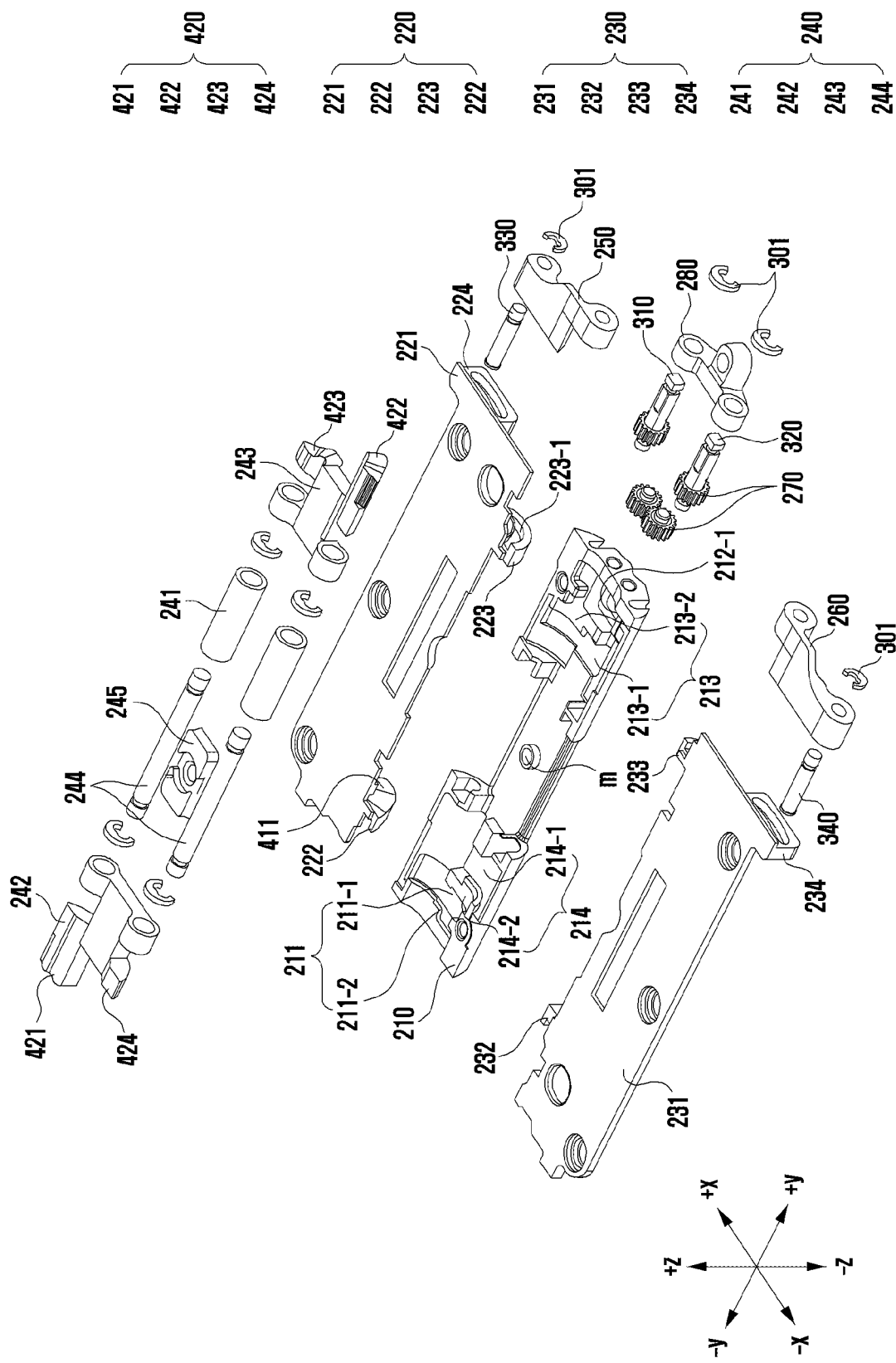
FIG. 2C is an exploded perspective view of the hinge apparatus according to various embodiments.

FIG. 2A is a front view and side view of a hinge apparatus according to various embodiments. Referring to FIG. 2A (a) is a front view of the hinge apparatus, and (b) and (c) of FIG. 2A are side views of the hinge apparatus. FIG. 2B is a perspective view of the hinge apparatus according to various embodiments. FIG. 2C is an exploded perspective view of the hinge apparatus according to various embodiments In the following description, the same or similar elements are described using the same reference numerals.

A hinge apparatus 200 described hereinafter may be included in the electronic device 100 described with reference to FIGS. 1A, 1B and 1C. For example, the hinge apparatus 200 may be included in the hinge 164 in FIG. 1C. The hinge apparatus 200 may be installed between a first housing (e.g., the first housing 110 in FIG. 1A) and second housing (e.g., the second housing 120 in FIG. 1A) of the electronic device, and may rotatably connect the first housing and the second housing. For example, a state of the electronic device may change into a folding state (e.g., the state illustrated in FIG. 1B), the intermediate state, or an unfolding state (e.g., the state illustrated in FIG. 1A) depending on a degree that the first housing and the second housing are rotated by the hinge apparatus 200. FIG. 1A illustrates by way of non-limiting example the electronic device that is folded using a length direction (e.g., the axis A in FIG. 1A) as an axis, but the hinge apparatus 200 may be used for a folding operation of an electronic device that is folded using a width direction perpendicular to the length direction as an axis. In addition, the hinge apparatus 200 may be used in various electronic devices in which an instrument installed in a way to be relatively rotated is used.

Figure 5:
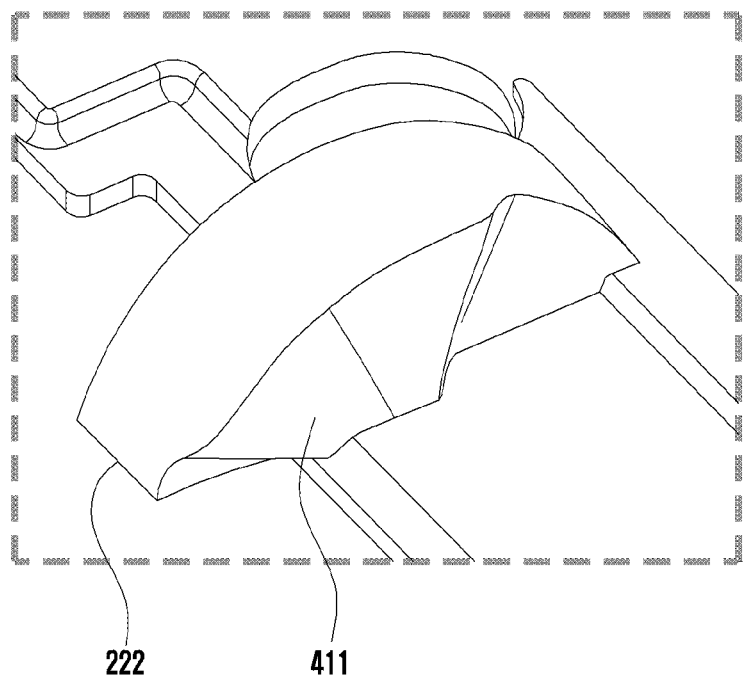

With reference to FIGS. 2A, 2B and 2C, the hinge apparatus 200 may include a bracket 210, a first body part 220 and a second body part 230, a torque provision unit 240, a first arm 250 and a second arm 260 and an interlocking member 270. The aforementioned elements of the hinge apparatus 200 are merely examples. At least one of the aforementioned elements may be omitted if necessary, and the hinge apparatus 200 may be constructed by adding another element. For example, the first arm 250, the second arm 260 and the interlocking member 270 may be omitted if necessary. With reference to FIG. 5, a hinge apparatus 201, including the first arm 250, the second arm 260 and the interlocking member 270, and a hinge apparatus 202, not including the first arm 250, the second arm 260 and the interlocking member 270, may be mixed and installed in the hinge of the electronic device.

In an embodiment, the bracket 210 may be a body of the hinge apparatus 200 by which elements of the hinge apparatus 200 may be mutually coupled together. The elements of the hinge apparatus 200 may be disposed centering around the bracket 210 and may be mutually coupled together or installed in a way to be interlocked. The first body part 220 and the second body part 230 may be rotated and the first arm 250 and the second arm 260 may be rotated around the middle of the bracket 210. A central axis K of the bracket 210 may be a rotation axis of the electronic device by the hinge apparatus 200. Accordingly, the bracket 210 may be disposed in the electronic device so that the central axis K of the bracket 210 and a rotation axis (e.g., the axis A in FIG. 1A) of the electronic device are identical with each other. The bracket 210 may be formed using various materials. For example, the bracket 210 may be formed using a metal material or a synthetic resin material. The bracket 210 may be formed using a very strong material in a way to stably support various elements of the hinge apparatus 200.

Figure 3A:
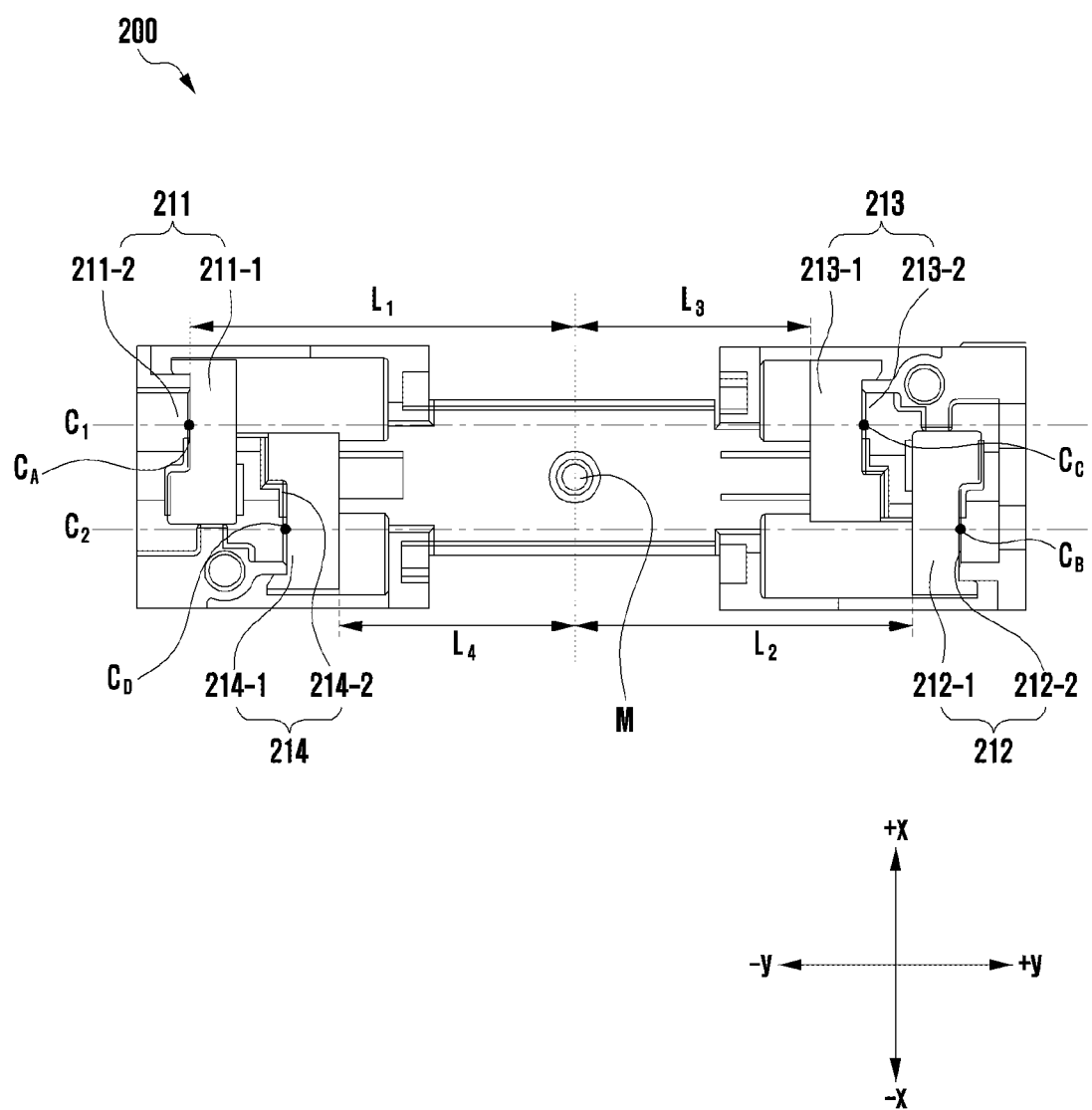
FIG. 3A is a front view of a bracket according to various embodiments.

With reference to FIG. 2C, the bracket 210 may include a first coupling part 211 and a second coupling part 212 (refer to FIG. 3A). The first coupling part 211 may be a part fastened to a first rotation part 222 of the first body part 220. The second coupling part 212 may be a part fastened to a second rotation part 233 of the second body part 230. The first rotation part 222 may be fastened to the first coupling part 211 so that the first rotation part 222 is rotatable around the bracket 210. The second rotation part 233 may be fastened to the second coupling part 212 so that the second rotation part 233 is rotatable around the bracket 210.

With reference to FIG. 2C, the bracket 210 may include a third coupling part 213 and a fourth coupling part 214. The third coupling part 213 may be a part fastened to a third rotation part 223 of the first body part 220. The fourth coupling part 214 may be a part fastened to a fourth rotation part 232 of the second body. The third rotation part 223 may be fastened to the third coupling part 213 so that the third rotation part 223 is rotatable around the bracket 210. The fourth rotation part 232 may be fastened to the fourth coupling part 214 so that the fourth rotation part 232 is rotatable around the bracket 210.

Hereinafter, reference is also made to FIGS. 3A, 3B and 3C in descriptions of coupling parts (e.g., the first coupling part, the second coupling part, the third coupling part and the fourth coupling part) and rotation parts (e.g., the first rotation part, the second rotation part, the third rotation part and the fourth rotation part).

FIG. 3A is a front view of a bracket according to various embodiments. FIG. 3B is a diagram illustrating a shape in which the bracket and the first body part are coupled together according to various embodiments. FIG. 3C is a diagram illustrating the state in which the first body part has been partially rotated with respect to the bracket according to various embodiments.

With reference to FIG. 3A, the first coupling part 211 may include a first opening 211-1 and a first rotation guide 211-2. The first opening 211-1 may be formed in the bracket 210. The first rotation guide 211-2 may be a part protruded and formed toward the first opening 211-1. The first rotation guide 211-2 may be inserted into a first rotation rail (e.g., a first rotation rail 222-1 in FIG. 4) formed in the first rotation part 222. The first rotation guide 211-2 and the first rotation rail may be formed in a form corresponding to each other. The first rotation guide 211-2 and the first rotation rail may have their cross section formed in a circle. As illustrated in FIGS. 3B and 3C, in the state in which the first rotation guide 211-2 of the first coupling part 211 has been inserted into the first rotation rail of the first rotation part 222, the first rotation part 222 may rotate around the bracket 210. A center $C_A$ of the first rotation guide 211-2 and the first rotation rail may be a rotation center of the first rotation part 222 rotating around the bracket 210.

For example, the second coupling part 212 may include a second opening 212-1 and a second rotation guide 212-2. The second opening 212-1 may be formed in the bracket 210. The second rotation guide 212-2 may be a part protruded and formed toward the second opening 212-1. The second rotation guide 212-2 may be inserted into a second rotation rail formed in the second rotation part 233. Although not illustrated, the second rotation rail may be understood as an element similar to a first rotation rail (e.g., the first rotation rail 222-1 in FIG. 4). The second rotation guide 212-2 and the second rotation rail may be formed in a form corresponding to each other. The second rotation guide 212-2 and the second rotation rail may have their cross section formed in a circle. In the state in which the second rotation guide 212-2 of the second coupling part 212 has been inserted into the second rotation rail of the second rotation part 233, the second rotation part 233 may rotate around the bracket 210. A center $C_D$ of the second rotation guide 212-2 and the second rotation rail may be a rotation center of the second rotation part 233 around the bracket 210.

For example, the third coupling part 213 may include a third opening 213-1 and a third rotation guide 213-2. The third opening 213-1 may be formed in the bracket 210. The third rotation guide 213-2 may be a part protruded and formed toward the third opening 213-1. The third rotation guide 213-2 may be inserted into a third rotation rail (e.g., the third rotation rail 223-1 in FIG. 2C) formed in the third rotation part 223. The third rotation guide 213-2 and the third rotation rail may be formed in a form corresponding to each other. The third rotation guide 213-2 and the third rotation rail may have their cross sections formed in a circle. As illustrated in FIGS. 3B and 3C, in the state in which the third rotation guide 213-2 of the third coupling part 213 has been inserted into the third rotation rail of the third rotation part 223, the third rotation part 223 may rotate around the bracket 210. A center $C_C$ of the third rotation guide 213-2 and the third rotation rail may be a rotation center of the third rotation part 223 rotating around the bracket 210.

For example, the fourth coupling part 214 may include a fourth opening 214-1 and a fourth rotation guide 214-2. The fourth opening 214-1 may be formed in the bracket 210. The fourth rotation guide 214-2 may be a part protruded and formed toward the fourth opening 214-1. The fourth rotation guide 214-2 may be inserted into a fourth rotation rail formed in the fourth rotation part 232. Although not illustrated, the fourth rotation rail may be understood as an element similar to a first rotation rail (e.g., the first rotation rail 222-1 in FIG. 4). The fourth rotation guide 214-2 and the fourth rotation rail may be formed in a form corresponding to each other. The fourth rotation guide 214-2 and the fourth rotation rail may have their cross sections formed in a circle. In the state in which the fourth rotation guide 214-2 of the fourth coupling part 214 has been inserted into the fourth rotation rail of the fourth rotation part 232, the fourth rotation part 232 may rotate around the bracket 210. A center $C_B$ of the fourth rotation guide 214-2 and the fourth rotation rail may be a rotation center of the fourth rotation part 232 around the bracket 210.

In an embodiment, the first coupling part 211 and the second coupling part 212 may be formed at different locations with respect to a middle M of the bracket 210. With reference to FIG. 3A, the first coupling part 211 may be formed in a first direction (e.g., a −Y direction in FIG. 3A) with respect to the middle M of the bracket 210. The second coupling part 212 may be formed in a second direction (e.g., a +Y direction in FIG. 3A) with respect to the middle M of the bracket 210. The first rotation part 222 fastened to the first coupling part 211 and the second rotation part 233 fastened to the second coupling part 212 may be disposed at different locations with respect to the middle of the bracket 210 depending on locations where the first coupling part 211 and the second coupling part 212 are formed.

In an embodiment, the third coupling part 213 and the fourth coupling part 214 may be formed at different locations with respect to the middle M of the bracket 210. With reference to FIG. 3A, the third coupling part 213 may be formed in the second direction (e.g., the +Y direction in FIG. 3A) with respect to the middle M of the bracket 210. The fourth coupling part 214 may be formed in the first direction (e.g., the −Y direction in FIG. 3A) with respect to the middle M of the bracket 210. The third rotation part 223 fastened to the third coupling part 213 and the fourth rotation part 232 fastened to the fourth coupling part 214 may be disposed at different locations with respect to the middle M of the bracket 210 depending on locations where the third coupling part 213 and the fourth coupling part 214 are formed.

With reference to FIG. 3A, a distance L1 from the middle M of the bracket 210 to the first coupling part 211 and a distance L3 from the middle M of the bracket 210 to the third coupling part 213 may be different from each other. For example, the distance L1 from the middle M of the bracket 210 to the first coupling part 211 may be longer than the distance L3 from the middle M of the bracket 210 to the third coupling part 213. A distance L4 from the middle M of the bracket 210 to the fourth coupling part 214 and a distance L2 from the middle M of the bracket 210 to the second coupling part 212 may be different from each other. For example, the distance L2 from the middle M of the bracket 210 to the second coupling part 212 may be longer than the distance L4 from the middle M of the bracket 210 to the fourth coupling part 214. In an embodiment, the first coupling part 211, the second coupling part 212, the third coupling part 213 and the fourth coupling part 214 may be disposed symmetrically with respect to the middle M of the bracket 210. For example, the distance L1 from the middle M of the bracket 210 to the first coupling part 211 and the distance L2 from the middle M of the bracket 210 to the second coupling part 212 may be the same. The distance L3 from the middle M of the bracket 210 to the third coupling part 213 and the distance L4 from the middle M of the bracket 210 to the fourth coupling part 214 may be the same.

In an embodiment, the first body part 220 and the second body part 230 may be installed in the bracket 210 in a way to be rotatable around the bracket 210. With reference to FIG. 2C, the first body part 220 may be disposed in a third direction (e.g., a +X direction in FIG. 2C) with respect to the bracket 210. The second body part 230 may be disposed in a fourth direction (e.g., a –X direction in FIG. 2C) with respect to the bracket 210. The first body part 220 may include a first plate 221, the first rotation part 222 and the third rotation part 223. The second body part 230 may include a second plate 231, the second rotation part 233 and the fourth rotation part 232.

In an embodiment, the first plate 221 and the second plate 231 may support a display (e.g., the display 130 in FIG. 1A). The display may include a first area (e.g., the first area 131a in FIG. 1A), a second area (e.g., the second area 131b in FIG. 1A) and a third area (e.g., the folding area 131c in FIG. 1A) between the first area and the second area. The first area, the second area and the third area may be conceptually divided from an area of the display for description, and may not be visually divided areas. The first plate 221 may support the first area of the display of the electronic device. The second plate 231 may support the second area of the electronic device. As the first plate 221 and the second plate 231 are rotated around the bracket 210, the first area and second area of the display may also rotate around the bracket 210. When the first area and second area of the display are rotated, the first area and the second area may be bent with respect to the third area.

In an embodiment, the first rotation part 222 and the third rotation part 223 may be coupled with the first plate 221. The first rotation part 222, the third rotation part 223 and the first plate 221 may be moved together. For example, the first rotation part 222 and the third rotation part 223 may be integrated and formed with the first plate 221. The first rotation part 222 and the third rotation part 223 may be coupled with the first plate 221 in various coupling ways (e.g., bolt coupling, rivet coupling, adhesion coupling, or welding coupling). The second rotation part 233 and the fourth rotation part 232 may be coupled with the second plate 231. The second rotation part 233, the fourth rotation part 232 and the second plate 231 may be moved together.

For example, the second rotation part 233 and the fourth rotation part 232 may be integrated and formed with the second plate 231. The second rotation part 233 and the fourth rotation part 232 may be coupled with the second plate 231 in various coupling ways (e.g., bolt coupling, rivet coupling, adhesion coupling, or welding coupling).

Figure 3B:
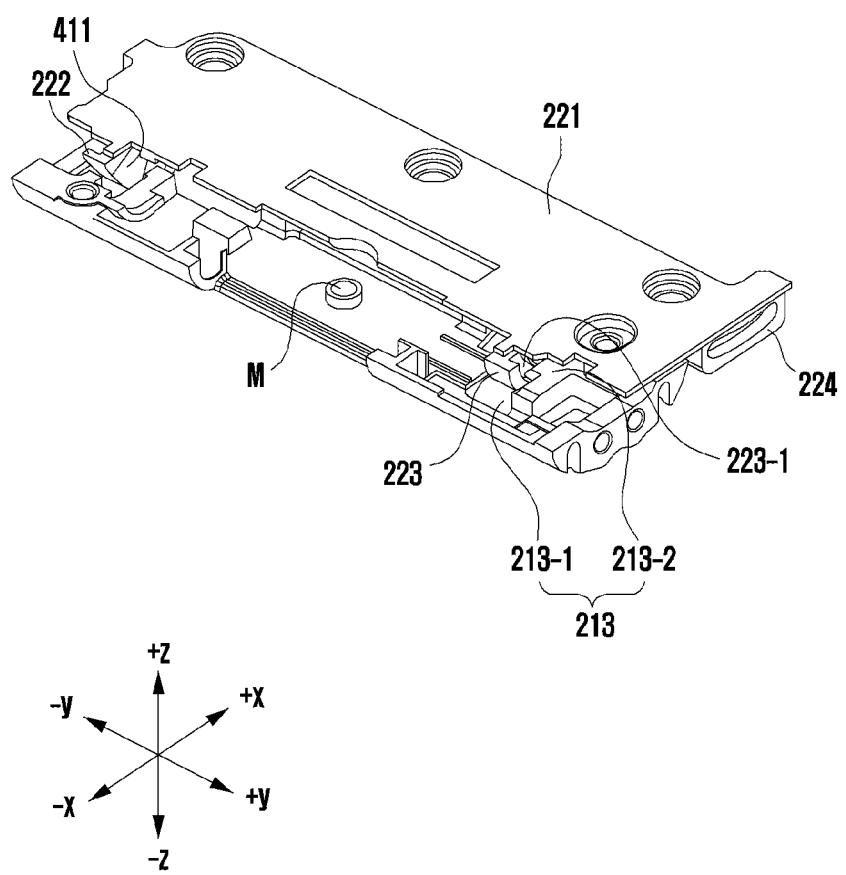
FIG. 3B is a perspective view illustrating a bracket and a first body part coupled together according to various embodiments.
Figure 3C:
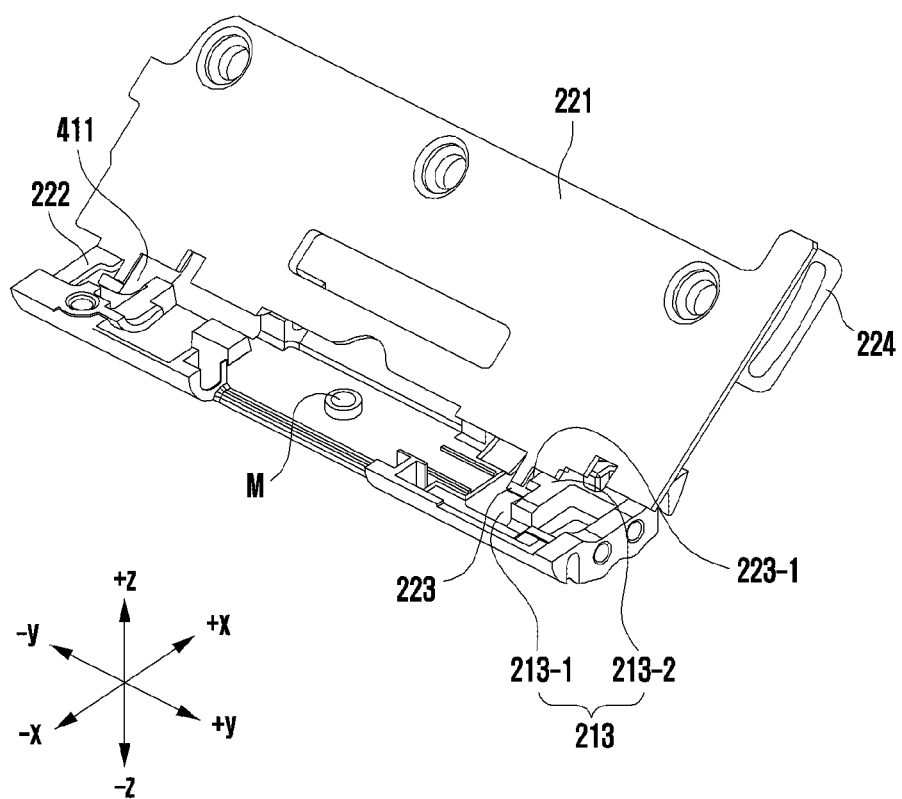
FIG. 3C is a perspective view illustrating the state in which the first body part has been partially rotated with respect to the bracket according to various embodiments.

As illustrated in FIGS. 3B and 3C, as the first rotation part 222 and the third rotation part 223 are installed in a way to be rotatable around the bracket 210, the first plate 221 may rotate around the bracket 210. As the second rotation part 233 and fourth rotation part 232 of the second body part 230 are installed in a way to be rotatable around the bracket 210, the second plate 231 may rotate around the bracket 210.

The rotation of the first plate 221 around the bracket 210 may be performed using the center $C_A$ of the first rotation guide 211-2 with which the first rotation part 222 is coupled and the center $C_C$ of the third rotation guide 213-2 with which the third rotation part 223 is coupled as their rotation centers. The center $C_A$ of the first rotation guide 211-2 may be understood as the rotation center of the first rotation part 222. The center $C_C$ of the third rotation guide 213-2 may be understood as the rotation center of the third rotation part 223. In an embodiment, the rotation center $C_A$ of the first rotation part 222 and the rotation center $C_C$ of the third rotation part 223 may pass through the same straight line C1, and may be parallel to a rotation axis (e.g., the axis A in FIG. 1A) of the electronic device. The rotation center $C_A$ of the first rotation part 222 and the rotation center $C_C$ of the third rotation part 223 may pass through the rotation axis C1 of the first body part 220 around the bracket 210. The rotation axis of the first body part 220 is hereinafter referred to as a first rotation axis C1.

The rotation of the second plate 231 around the bracket 210 may be performed using the center $C_B$ of the second rotation guide 212-2 with which the second rotation part 233 is coupled and the center $C_D$ of the fourth rotation guide 214-2 with which the fourth rotation part 232 is coupled as rotation centers. The center $C_B$ of the second rotation guide 212-2 may be understood as the rotation center of the second rotation part 233. The center $C_D$ of the fourth rotation guide 214-2 may be understood as the rotation center of the fourth rotation part 232. In an embodiment, the rotation center $C_B$ of the second rotation part 233 and the rotation center $C_D$ of the fourth rotation part 232 may pass through the same straight line, and may be parallel to the rotation axis of the electronic device. The rotation center $C_B$ of the second rotation part 233 and the rotation center $C_D$ of the fourth rotation part 232 may be a rotation axis C2 of the second body part 230 around the bracket 210. The rotation axis C2 of the second body part 230 may be hereinafter referred to as a second rotation axis C2.

In an embodiment, the torque provision unit 240 may include a first follower 242, a second follower 243 and a pressurizing member 241.

With reference to FIGS. 2A, 2B and 2C, the pressurizing member 241 may be disposed in the bracket 210 between the first follower 242 and the second follower 243. The pressurizing member 241 may pressurize the first follower 242 and the second follower 243 in opposite directions. The pressurizing member 241 may include an elastic member such as a spring. The first follower 242 may be closely attached to the first rotation part 222 and the fourth rotation part 232 by being pressurized by the pressurizing member 241. The second follower 243 may be closely attached to the second rotation part 233 and the third rotation part 223 by being pressurized by the pressurizing member 241. The first follower 242 may include a first cam part 421 and a fourth cam part 424. The second follower 243 may include a second cam part 422 and a third cam part 423. They are described in detail later.

In an embodiment, the torque provision unit 240 may include two shafts 244 rotatably installed in the bracket 210. The two shafts 244 may be installed in the bracket 210. The first follower 242 and the second follower 243 may be installed at both ends of the shafts 244, respectively. The pressurizing member 241 may be inserted into each of the shafts 244. The pressurizing member 241 may be a spring, for example. With reference to FIGS. 2A, 2B and 2C, the pressurizing members 241 inserted into the shafts 244 may be compressed against the first follower 242 and the second follower 243 installed at both ends of the shafts 244. The pressurizing members 241 inserted into the shafts 244 in the compressed state may pressurize the first follower 242 and the second follower 243 in opposite directions.

In an embodiment, the torque provision unit 240 may be fixed and installed in the bracket by a fixing part 245.

In an embodiment, the first arm 250 may be rotatably installed in the bracket 210. With reference to FIG. 2C, the first arm 250 may be rotatably installed in the bracket 210 through a first shaft 310 inserted into the bracket 210. The first shaft 310 may be a rotation axis of the first arm 250. The first arm 250 may be connected to the first body part 220. The first arm 250 may be connected to the first body part 220 through a first pin 330. The second arm 260 may be rotatably installed in the bracket 210. With reference to FIGS. 2A and 2C, the second arm 260 may be rotatably installed in the bracket 210 through a second shaft 320 inserted into the bracket 210. The second shaft 320 may be a rotation axis of the second arm 260. The second arm 260 may be connected to the second body part 230. The second arm 260 may be connected to the second body part 230 through a second pin 340.

In an embodiment, the interlocking member 270 may interlock the rotation of the first arm 250 and the second arm 260 around the bracket 210. The first arm 250 and the second arm 260 may rotate around the bracket 210 by being interlocked by the interlocking member 270. The first arm 250 and the second arm 260 may be interlocked by the interlocking member 270 in a way to be rotated in opposite directions. The first arm 250 and the second arm 260 may be rotated together in a direction in which the electronic device is unfolded or folded. The interlocking member 270 may include a plurality of gears as illustrated in FIG. 2C, for example. The plurality of gears included in the interlocking member 270 may be an even number so that the first arm 250 and the second arm 260 are interlocked and rotated in opposite directions. Some of the plurality of gears may be inserted into the first shaft 310 and the second shaft 320. In an embodiment, the interlocking member 270 may include an interlocking body 280. The interlocking body 280 may be inserted into the first shaft 310 and the second shaft 320. With reference to FIG. 2C, the gears of the interlocking member 270—the first arm 250—the interlocking body 280 may be inserted into the first shaft 310. A fixing member 301 fitted into the end of the first shaft 310 may enable elements inserted into the first shaft 310 to maintain the state in which the elements have been inserted into the first shaft 310. The gears of the interlocking member 270, the second arm 260, the interlocking body 280 may be inserted into the second shaft 320. The fixing member 301 fitted into the end of the second shaft 320 may enable elements inserted into the second shaft 320 to maintain the state in which the elements have been inserted into the second shaft 320.

In an embodiment, the first arm 250 and the first body part 220 may be connected by the first pin 330. The first arm 250 and the first body part 220 connected to the first pin 330 may be rotated together around the bracket 210. The rotation axis (the first shaft 310) of the first arm 250 and the rotation axis (the first rotation axis C1) of the first body part 220 may be disposed at different locations. For this reason, rotation tracks of the first arm 250 and the first body part 220 may be different from each other. In order to compensate for such a difference, the first pin 330 may be inserted into a first compensation rail 224 formed in the first body part 220. The first compensation rail 224 may be formed in one direction (e.g., the X axis direction in FIG. 2C) of the first body part 220. In a process of the first arm 250 and the first body part 220 rotating, the first pin 330 may move along the first compensation rail 224. The second arm 260 and the second body part 230 may be connected by the second pin 340. The second arm 260 and the second body part 230 connected to the second pin 340 may be rotated around the bracket 210. The rotation axis (the second shaft 320) of the second arm 260 and the rotation axis (the second rotation axis C2) of the second body part 230 may be disposed at different locations. For this reason, rotation tracks of the second arm 260 and the second body part 230 may be different from each other. In order to compensate for such a difference, the second pin 340 may be inserted into a second compensation rail 234 formed in the second body part 230. The second compensation rail 234 may be formed in one direction (e.g., the X axis direction in FIG. 2C) of the second body part 230. In a process of the second arm 260 and the second body part 230 rotating, the second pin 340 may move along the second compensation rail 234. Since the first arm 250 and the first body part 220 are connected and rotated together and the second arm 260 and the second body part 230 are connected and rotated together, the rotations of the first body part 220 and the second body part 230 may also be interlocked by the interlocking member 270 that interlocks the first arm 250 and the second arm 260. The interlocking member 270 may interlock the rotations of the first body part 220 and the second body part 230 so that the first body part 220 and the second body part 230 are rotated in opposite directions. With reference to FIG. 2C, since the fixing members 301 are fitted into the ends of the first pin 330 and the second pin 340, respectively, the first body part 220 and the first arm 250 can maintain the state in which they have been inserted into the first pin 330, and the second body part 230 and the second arm 260 can maintain the state in which they have been inserted into the second pin 340.

In the above description, the first body part 220 has been described as including the first rotation part 222 and the third rotation part 223 and the second body part 230 has been described as including the second rotation part 232 and the fourth rotation part 233, but the first body part 220 may include only the first rotation part 222 and the second body part 230 may include only the second rotation part 232. In this case, an element (e.g., the third coupling part 213, the third cam part 423) corresponding to the third rotation part 223 may be omitted. An element (e.g., the fourth coupling part 214, the fourth cam part 424) corresponding to the fourth rotation part 233 may be omitted.

Figure 4:
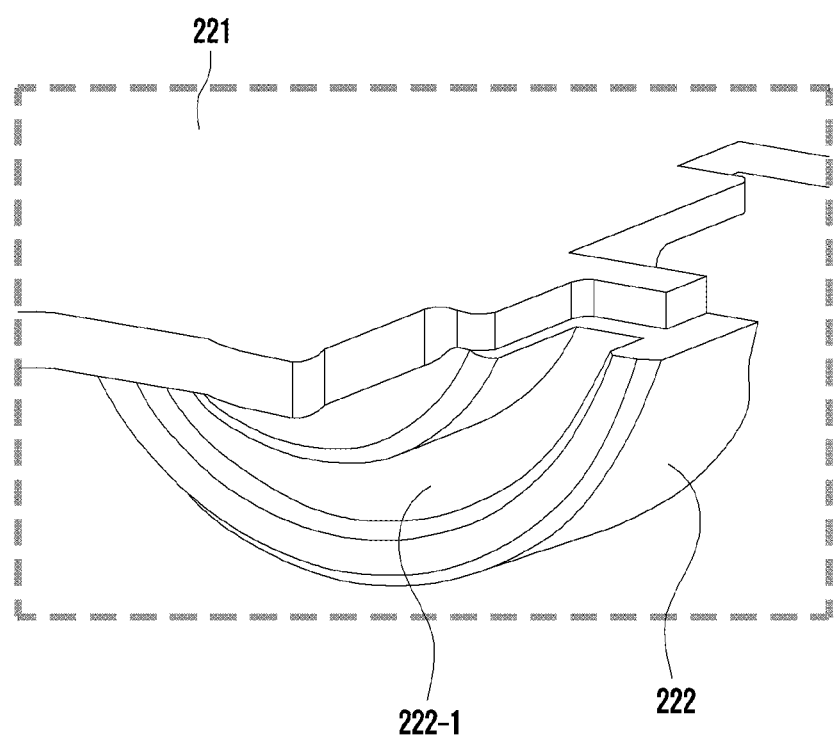
FIGS. 4 and 5 are partial perspective views of a rotation part according to various embodiments.

FIGS. 4 and 5 are perspective views of a rotation part according to various embodiments.

Hereinafter, a rotation part 222 (e.g., the first rotation part 222, the second rotation part 232, the third rotation part 223 and the fourth rotation part 233) is described with reference to FIGS. 4 and 5. In the following description, the first rotation part 222 to the fourth rotation part 233 are unified and described as the "rotation part 222."

With reference to FIG. 4, a part of a cross section of the rotation part 222 may be formed in a circle. A rotation rail 222-1 extended along a part formed in a circle may be formed on one side of the rotation part 222. When the rotation part 222 is installed in a coupling part (e.g., the first coupling part 211, the second coupling part 212, the third coupling part 213 and the fourth coupling part 214), a rotation guide (e.g., the first rotation guide 211-2, the second rotation guide 212-2, the third rotation guide 213-2 and the fourth rotation guide 214-2) of the coupling part may be inserted into the rotation rail 222-1. The rotation of the rotation part 222 around the bracket 210 may be performed by the rotation guide inserted into the rotation rail 222-1.

With reference to FIG. 5, a cam structure 411 may be formed along the rotation part 222 formed in a circle on the other side of the rotation part 222. The cam structure 411 may be formed in a part of the rotation part 222. The cam structure 411 may be engaged with a cam part 420 formed in a follower (e.g., the first follower 242, the second follower 243 in FIG. 2C) of the torque provision unit 240 that is described later, thereby generating torque.

Figure 6:
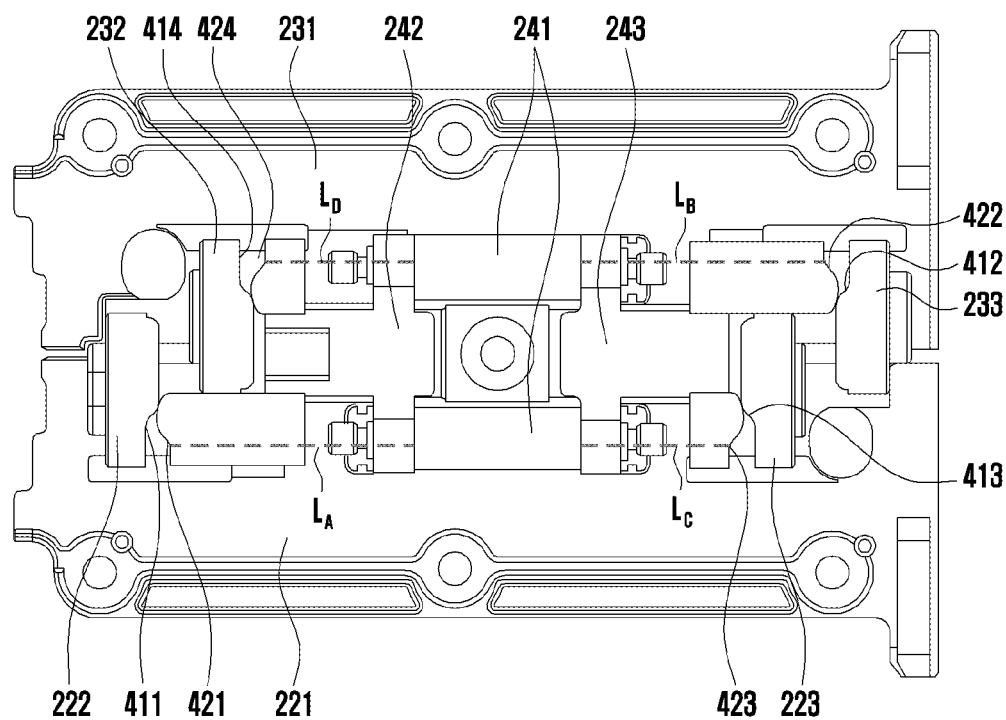
FIG. 6 is a rear view of the hinge apparatus according to various embodiments.
Figure 6:
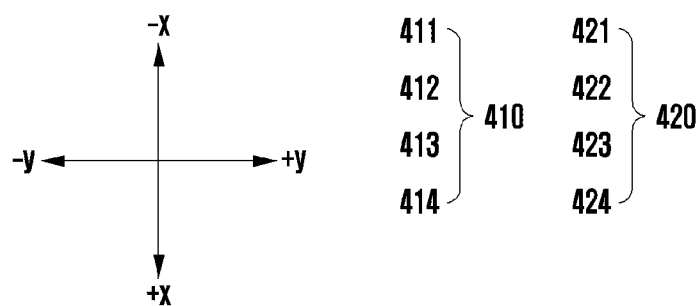

FIG. 6 is a rear view of the hinge apparatus according to various embodiments.

With reference to FIG. 6, when viewed in a −Y direction in FIG. 6, the first rotation part 222 and the fourth rotation part 232 may be disposed in the bracket 210 in a way to be partially overlapped. When viewed in a +Y direction in FIG. 6, the second rotation part 233 and the third rotation part 223 may be disposed in the bracket 210 in a way to be partially overlapped. A rotational radius (e.g., R1 in FIG. 8A) of the first rotation part 222 and a rotational radius (e.g., R2 in FIG. 8A) of the fourth rotation part 232 may be disposed to overlap.

Figure 8A:
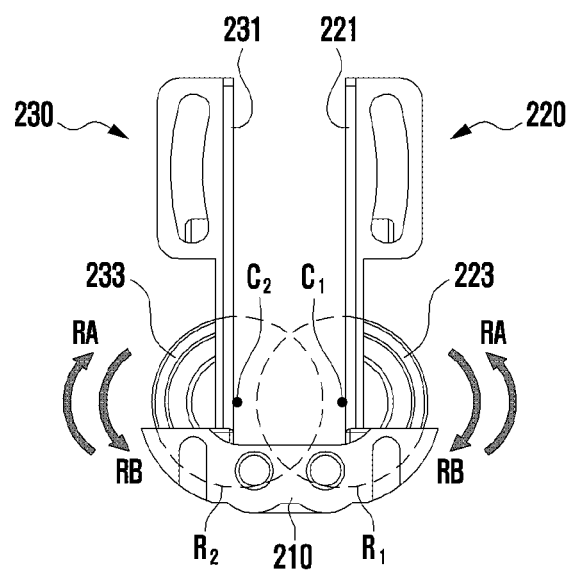
FIGS. 8A, 8B and 8C are diagrams illustrating contact relations between a cam part and a cam structure according to various embodiments.
Figure 8A:
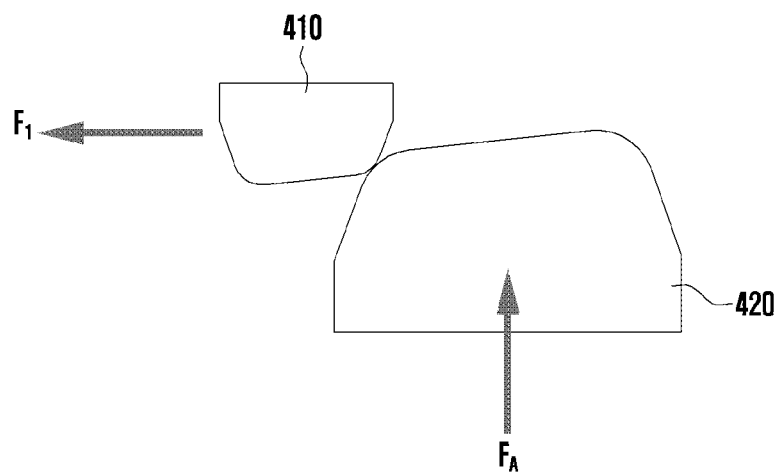

The rotations of first body part 220 and the second body part 230 may be composed of the rotation of the first rotation part 222 and the third rotation part 223 and the rotation of the second rotation part 233 and the fourth rotation part 232 around the bracket 210. The radius of the rotation part may be formed so that the first rotation part 222, the second rotation part 233, the third rotation part 223 and the fourth rotation part 232 are stably installed in the bracket 210. If the radius of the rotation part is great, the rotation can be stably performed because an area of the rotation part coming into contact with the bracket 210 is increased. Meanwhile, a separation distance between a first rotation axis (e.g., the first rotation axis C1 in FIG. 3A) and a second rotation axis (e.g., the second rotation axis C2 in FIG. 3A) may be determined based on a radius of curvature of a display. In this case, the radius of curvature may refer, for example, to the radius of curvature in which the display can be stably folded. The radius of curvature may be a design specification of a display and may be variously changed depending on a design of a display. For example, folding curvature may be different depending on a material that includes a display or a support structure for a display. The separation distance between the first rotation axis C1 and the second rotation axis may be determined based on a radius of curvature of a display. For example, in the case of a display having a large radius of curvature, the separation distance between the first rotation axis C1 and the second rotation axis C2 may be large compared to a display having a small radius of curvature. If the radius of the rotation part is increased, as illustrated in FIG. 8A, the rotational radius R1 of the first rotation part 222 and the third rotation part 223 and the rotational radius R2 of the second rotation part 233 and the fourth rotation part 232 may be overlapped. Locations where the first coupling part 211 and the fourth coupling part 214 are formed may be determined so that the first rotation part 222 and the fourth rotation part 232 are overlapped. Locations where the second coupling part 212 and the third coupling part 213 are formed may be determined so that the second rotation part 233 and the third rotation part 223 are overlapped. By structures in which the first rotation part 222 and the fourth rotation part 232 are overlapped and the second rotation part 233 and the third rotation part 223 are overlapped, the radius of the rotation part can be increased, and the first rotation axis C1 and the second rotation axis C2 can be sufficiently brought close to each other depending on a radius of curvature of a display.

In an embodiment, the first follower 242 may include a first cam part 421 formed in a shape corresponding to a first cam structure 411 in a way to be engaged with the first cam structure 411 and a fourth cam part 424 formed in a shape corresponding to a fourth cam structure 414 in a way to be engaged with the fourth cam structure 414. With reference to FIG. 6, a distance to the first rotation part 222 in which the first cam structure 411 is formed and a distance to the fourth rotation part 232 in which the fourth cam structure 414 is formed with respect to the middle of the bracket 210 may be different from each other. Shapes of a part where the first cam part 421 has been formed and a part where the fourth cam part 424 has been formed in the first follower 242 may be determined so that the first follower 242 can be pressurized by the pressurizing member 241 and closely attached to the first rotation part 222 and the fourth rotation part 232. For example, if the distance L1 from the middle M of the bracket 210 to the first rotation part 222 is longer than the distance L4 from the middle M of the bracket 210 to the fourth rotation part 232 as illustrated in FIG. 3A, as illustrated in FIG. 6, a length LA from one end of the first follower 242 to a part where the first cam structure 411 has been formed may be longer than a length $L_D$ from the one end of the first follower 242 to a part where the fourth cam structure 414 has been formed. When the pressurizing member 241 pressurizes the first follower 242, the first follower 242 may be closely attached to the first rotation part 222 and the fourth rotation part 232, thus pressurizing the first rotation part 222 and the fourth rotation part 232. Torque may occur in the first rotation part 222 and the fourth rotation part 232 due to the engagement structure of the first cam structure 411 and the first cam part 421 and the engagement structure of the fourth cam structure 414 and the fourth cam part 424.

In an embodiment, the second follower 243 may include a second cam part 422 formed in a shape corresponding to a second cam structure 412 in a way to be engaged with the second cam structure 412 and a third cam part 423 formed in a shape corresponding to a third cam structure 413 in a way to be engaged with the third cam structure 413. With reference to FIG. 6, a distance to the second rotation part 233 in which the second cam structure 412 is formed and a distance to the third rotation part 223 in which the third cam structure 413 is formed with respect to the middle of the bracket 210 may be different from each other. Shapes of a part where the second cam part 422 has been formed and a part where the third cam part 423 has been formed in the second follower 243 may be determined so that the second follower 243 may be pressurized by the pressurizing member 241 and closely attached to the second rotation part 233 and the third rotation part 223. For example, if the distance L2 from the middle M of the bracket 210 to the second rotation part 233 is longer than the distance L3 from the middle M of the bracket 210 to the third rotation part 223 as illustrated in FIG. 3A, with reference to FIG. 6, a length $L_B$ from one end of the second follower 243 to a part where the second cam structure 412 has been formed may be longer than a length $L_C$ from the one end of the second follower 243 to a part where the third cam structure 413 has been formed. When the pressurizing member 241 pressurizes the second follower 243, the second follower 243 may be closely attached to the second rotation part 233 and the third rotation part 223, thus pressurizing the second rotation part 233 and the third rotation part 223. At this time, torque may occur in the second rotation part 233 and the third rotation part 223 due to the engagement structure of the second cam structure 412 and the second cam part 422 and the engagement structure of the third cam structure 413 and the third cam part 423.

As the pressurizing member 241 of the torque provision unit 240 closely attaches the first follower 242 and the second follower 243 to the rotation parts 222, 223, 232, and 233, torque may be provided to the rotation parts 222, 223, 232, and 233. The torque may be involved in an operation of requiring an external force or higher for the rotations of the rotation parts 222, 223, 232, and 233 (hereinafter referred to as a "pause operation"). Furthermore, the torque may be involved in an operation of stopping rotation in the state in which an external force has not been provided (hereinafter referred to as a "free stop operation") when the electronic device is in the intermediate state between the unfolding state and the folding state.

Figure 7A:
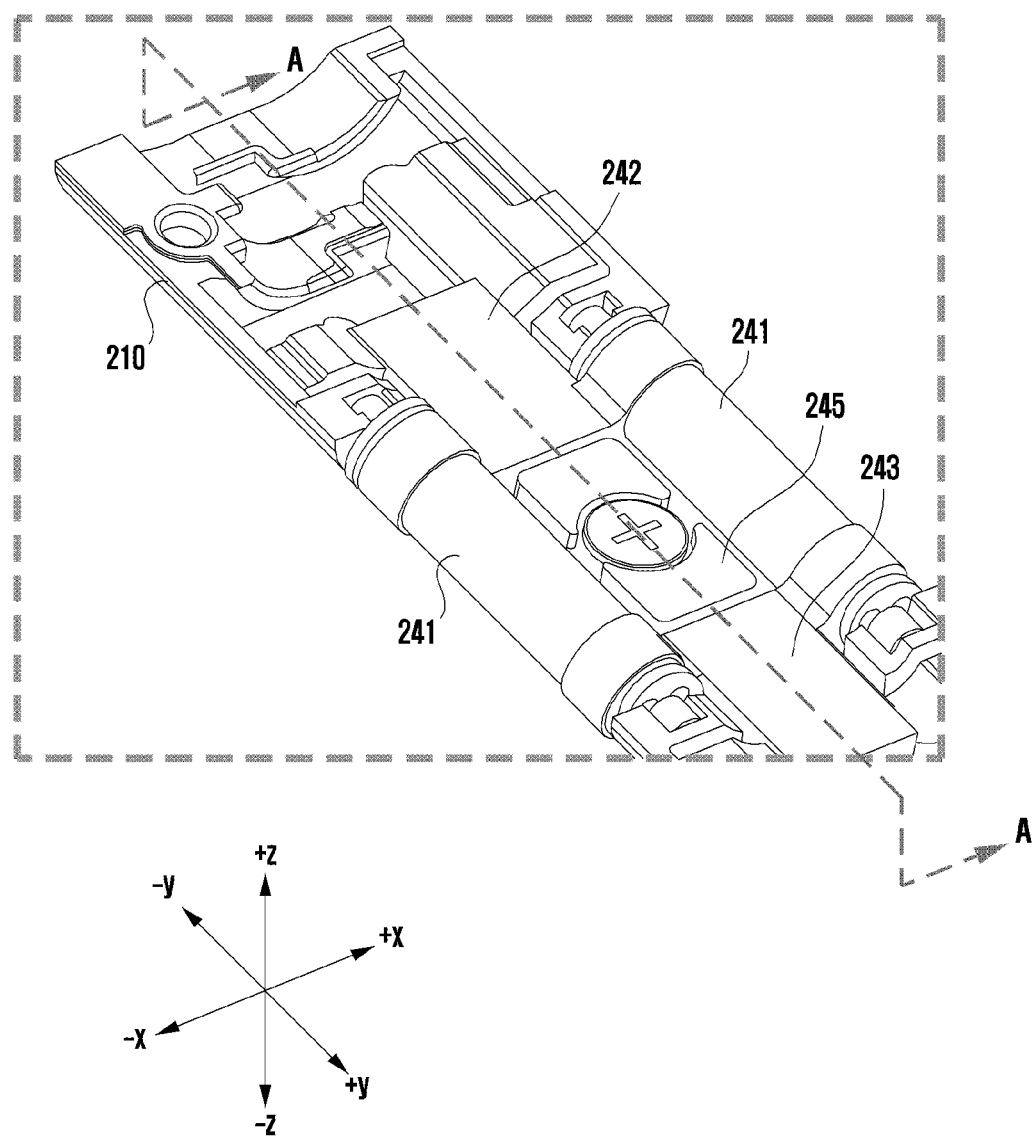
FIG. 7A is a perspective view of a bracket and a torque provision unit according to various embodiments.
Figure 7B:
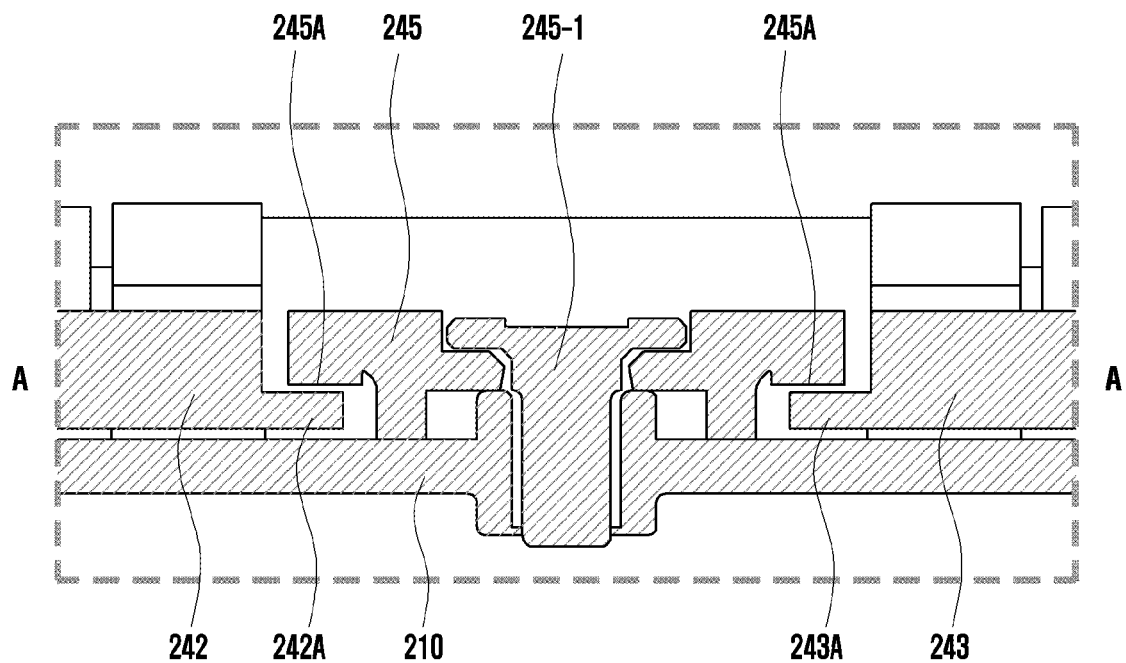
FIG. 7B is a cross-sectional view of the bracket and torque provision unit illustrated in FIG. 7A, which is partially taken along line A-A according to various embodiments.
Figure 7B:
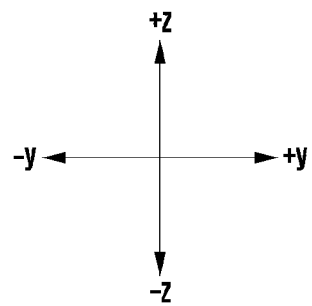
Figure 7C:
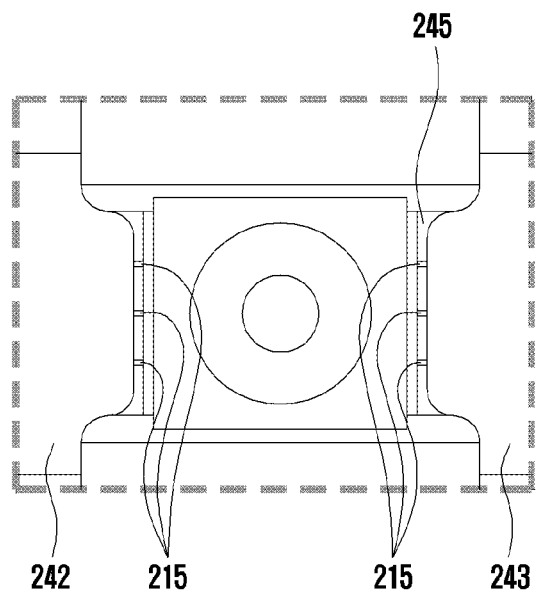
FIGS. 7C and 7D are diagrams illustrating follower guide rails formed in a bracket according to various embodiments.
Figure 7D:
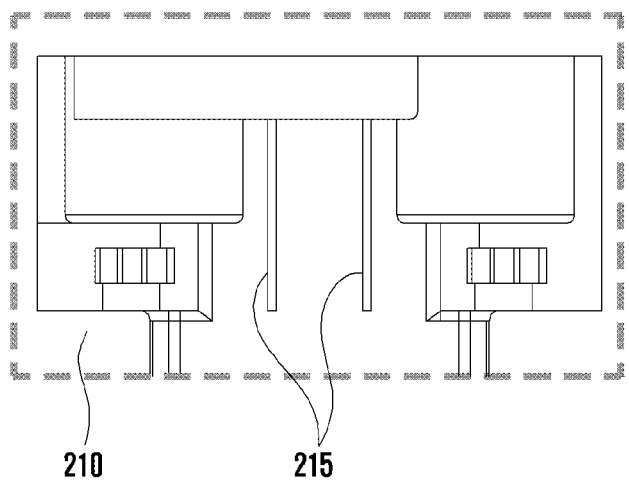

FIG. 7A is a perspective view of a bracket and a torque provision unit according to various embodiments. FIG. 7B is a cross-sectional view of the bracket and torque provision unit illustrated in FIG. 7A, which is partially taken along line A-A. FIGS. 7C and 7D are diagrams illustrating follower guide rails formed in a bracket according to various embodiments.

In an embodiment, the torque provision unit 240 may be fixed to the bracket 210 by the fixing part 245. With reference to FIGS. 7A and 7B, the fixing part 245 may be fixed to the bracket 210 and may fix the torque provision unit 240. For example, the fixing part 245 may be fixed to the bracket 210 in a bolt (245-1) coupling way. With reference to FIG. 7B, when the fixing part 245 is fixed to the bracket 210, a rib 245A of the fixing part 245 may come into contact with each of ribs 242A and 243A formed in the first follower 242 and the second follower 243, respectively. The rib 245A of the fixing part 245 fixed to the bracket 210 comes into contact with each of the ribs 242A and 243A formed in the first follower 242 and the second follower 243, respectively, so that the first follower 242 and the second follower 243 may not move in a direction (e.g., a +Z direction in FIG. 7B) in which the first follower 242 and the second follower 243 become distant from the bracket 210. The fixing part 245 may fix the first follower 242 and the second follower 243 so that the first follower 242 and the second follower 243 do not move in the +Z direction in FIG. 7B with respect to the bracket 210 in a process of the first follower 242 and the second follower 243 being moved with respect to the bracket 210 by being pressurized by the pressurizing member 241.

In an embodiment, with reference to FIGS. 7C and 7D, follower guide rails 215 may be formed in the bracket 210 and the fixing part 245. The follower guide rails 215 may be grooves concavely formed in the bracket 210 and the fixing part 245 so that follower guides (not illustrated) formed in the first follower 242 and the second follower 243 are accommodated in the grooves. The follower guides formed in the first follower 242 and the second follower 243 may be protruded and formed in the first follower 242 and the second follower 243 in a way to be inserted into the follower guide rails 215. The follower guide rails 215 may guide motion directions of the first follower 242 and the second follower 243. The follower guide rails 215 may be extended and formed in directions in which the first follower 242 and the second follower 243 are moved. As the follower guides of the first follower 242 and the second follower 243 are inserted into the follower guide rails 215, the first follower 242 and the second follower 243 may linearly move without being shaken in a direction (e.g., a Y axis direction in FIG. 7A) in which the bracket 210 is extended.

The first arm 250, the second arm 260 and the interlocking member 270 may interlock the first body part 220 and the second body part 230. In this case, the interlocking of the first body part 220 and the second body part 230 may not be perfectly performed according to circumstances. For example, the first body part 220 and the second body part 230 may not move together due to a manufacturing tolerance. In this case, one of a contact between the first cam part 421 of the first follower 242 and the first cam structure 411 and a contact between the fourth cam part 424 thereof and the fourth cam structure 414 may first occur. As described above, although one of the first cam part 421 or fourth cam part 424 of the first follower 242 first comes into contact with the other instrument, the first follower 242 can perform a designated motion (a straight-line motion in the direction (e.g., the Y axis direction in FIG. 2C) in which the bracket 210 is extended) because the follower guides are inserted into the follower guide rails 215. Likewise, one of a contact between the second cam part 422 of the second follower 243 and the second cam structure 412 and a contact between the third cam part 423 thereof and the third cam structure 413 may first occur. Although the second cam part 422 or third cam part 423 of the second follower 243 first comes into contact with the other instrument, the second follower 243 can perform a designated motion (a straight-line motion in the direction (e.g., the Y axis direction in FIG. 2C) in which the bracket 210 is extended) because the follower guides are inserted into the follower guide rails 215.

Figure 8B:
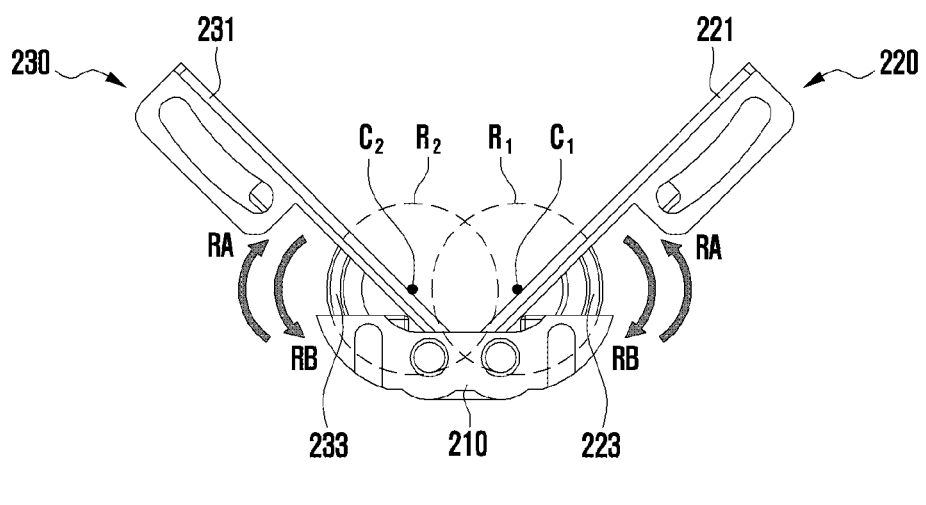
Figure 8B:
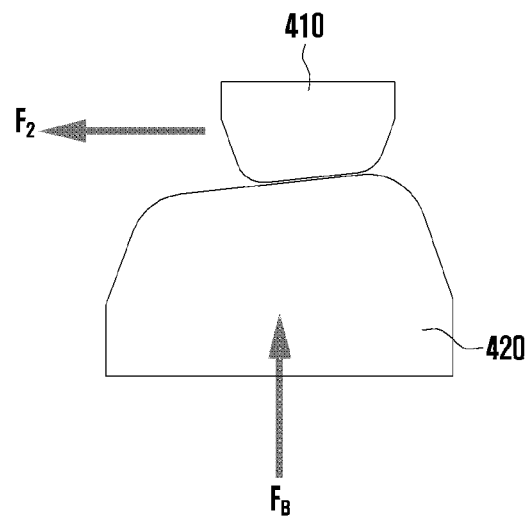
Figure 8C:
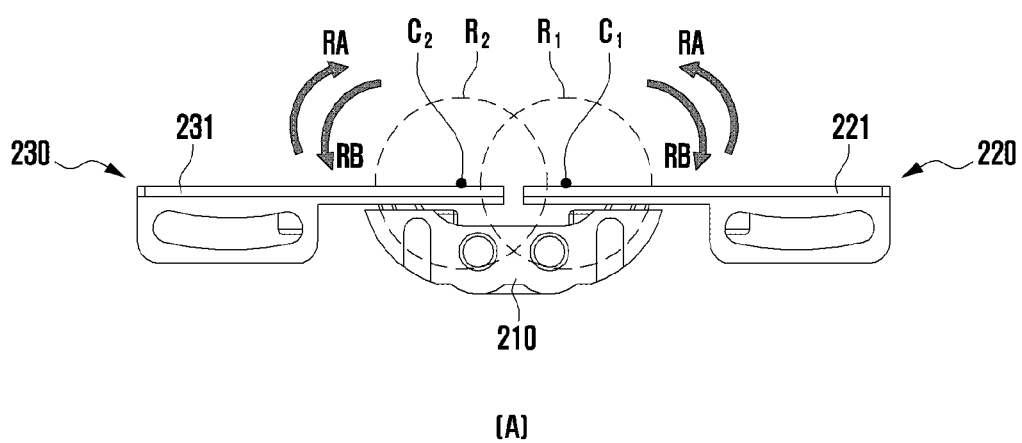
Figure 8C:
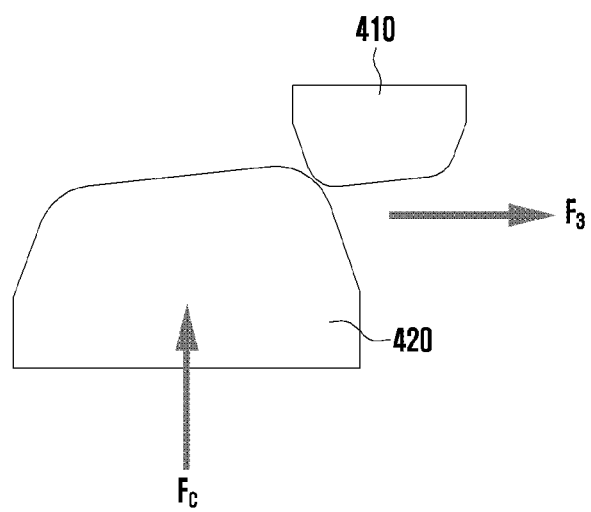

FIGS. 8A, 8B and 8C are diagrams for describing contact relations between a cam part and a cam structure according to various embodiments. Referring to FIG. 8A, (A) is a diagram illustrating a shape when the electronic device is in the folding state. (B) of FIG. 8A is a schematic diagram of a contact relation between the cam part and the cam structure when the electronic device is in the folding state. (A) of FIG. 8B is a diagram illustrating a shape when the electronic device is in the intermediate state. (B) of FIG. 8B is a schematic diagram of a contact relation between the cam part and the cam structure when the electronic device is in the intermediate state. (A) of FIG. 8C is a diagram illustrating a shape when the electronic device is in the unfolding state. (B) of FIG. 8C is a schematic diagram of a contact relation between the cam part and the cam structure when the electronic device is in the unfolding state.

The pressurizing member 241 of the torque provision unit 240 may pressurize the first follower 242 and the second follower 243 so that the first follower 242 and the second follower 243 are moved in the direction (e.g., the Y axis direction in FIG. 2C) in which the bracket 210 is extended). The first cam part 421 of the first follower 242 may be engaged with the first cam structure 411 of the first rotation part 222. The fourth cam part 424 may be engaged with the fourth cam structure 414 of the fourth rotation part 232. Furthermore, the second cam part 422 of the second follower 243 may be engaged with the second cam structure 412 of the second rotation part 233. The third cam part 423 may be engaged with the third cam structure 413 of the third rotation part 223.

A relation between forces acting when the electronic device is in the folding state is described with reference to FIG. 8A. When the first follower 242 and the second follower 243 are pressurized by the pressurizing member 241, the cam part 420 may pressurize ($F_A$) the cam structure 410. The cam part 420 engaged with the cam structure 410 may be rightward applied with a force F1 on the basis of (B) of FIG. 8A. The force may be torque that rotates the first body part 220 and the second body part 230 in a direction (e.g., a direction $R_A$ in (A) of FIG. 8A) in which the electronic device is folded. Accordingly, the pause operation in which the electronic device may maintain the folding state may be implemented by an engaged shape of the cam part 420 and the cam structure 410 and the pressurization of the cam part 420.

A relation between forces when the electronic device is in the intermediate state is described with reference to FIG. 8B. When the electronic device is in the intermediate state, as illustrated in (B) of FIG. 8B, an engaged part of the cam part 420 and the cam structure 410 may have a slope. When the cam part 420 pressurizes ($F_B$) the cam structure 410 due to the slope, the cam structure 410 may be rightward applied with a force F2 on the basis of (B) of FIG. 8B. Torque generated by the force may be torque that rotates the first body part 220 and the second body part 230 in a direction (e.g., the direction $R_A$ in (A) of FIG. 8B) in which the electronic device is folded. A basic state of a display of the electronic device is a state in which the display has been fully unfolded, so a restoring force by which the display is to be unfolded from the folding state may act on the display. The intermediate state is a state in which the display of the electronic device has been partially folded. In this state, the first body part 220 and the second body part 230 may be applied with a force in a direction (e.g., a direction $R_B$ (A) of FIG. 8B) in which the electronic device is unfolded by the restoring force of the display. As the cam part 420 provides torque to the first body part 220 and the second body part 230 in the direction $R_A$ in which the electronic device is folded by pressurizing the cam structure 410, equilibrium of a force with the restoring force of the display may be achieved. Accordingly, the free stop operation in which the electronic device may maintain the intermediate state without the supply of an external force can be implemented.

A relation between forces when the electronic device is in the unfolding state is described with reference to FIG. 8C. When the first follower 242 and the second follower 243 are pressurized by the pressurizing member 241, the cam part 420 may pressurize (Fc) the cam structure 410. The cam structure 410 engaged with the cam part 420 may be leftward applied with a force F3 on the basis of (B) of FIG. 8B. The force may be torque that rotates the first body part 220 and the second body part 230 in a direction (e.g., $R_A$ in (A) of FIG. 8C) in which the electronic device is unfolded. Accordingly, the pause operation in which the electronic device may maintain the unfolding state can be implemented by an engaged shape of the cam part 420 and the cam structure 410 and the pressurization of the cam part 420.

Figure 9:
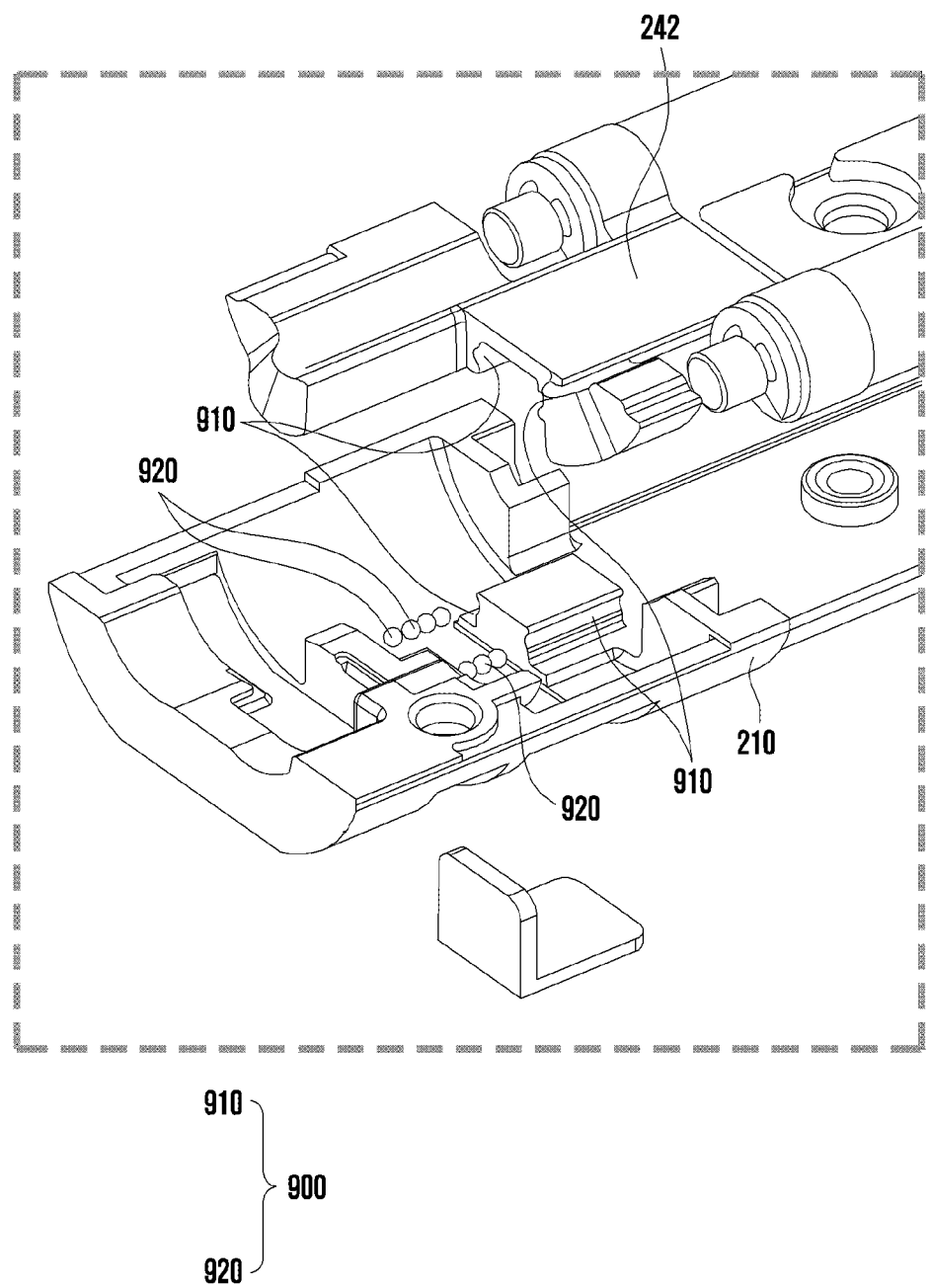
FIG. 9 is an exploded perspective view of a bracket and a follower according to various embodiments.

FIG. 9 is a partial exploded perspective view of a bracket and a follower according to various embodiments.

According to various embodiments, the hinge apparatus 200 may further include a bearing member 900. In an embodiment, the bearing member 900 may include a ball guide rail 910 and balls 920.

With reference to FIG. 9, the ball guide rail 910 may be formed between the first follower 242 and the bracket 210 and between the second follower 243 and the bracket 210. The balls 920 may be accommodated in the ball guide rail 910. The balls 920 accommodated in the ball guide rail 910 may guide motions of the first follower 242 and the second follower 243 for the bracket 210 so that the motions are smoothly performed. The bearing member 900 may compensate for a tolerance between the bracket 210, and the first follower 242 and the second follower 243. The bearing member 900 may guide motions of the first follower 242 and the second follower 243 so that the motions of the first follower 242 and the second follower 243 for the bracket 210 are linearly performed without shaking.

The first arm 250, the second arm 260 and the interlocking member 270 described with reference to FIGS. 2A, 2B and 2C may interlock the first body part 220 and the second body part 230. However, the interlocking of the first body part 220 and the second body part 230 may not be perfectly performed according to circumstances. For example, the first body part 220 and the second body part 230 may not move together due to a manufacturing tolerance. In this case, one of a contact between the first cam part 421 of the first follower 242 and the first cam structure 411 and a contact between the fourth cam part 424 thereof and the fourth cam structure 414 may first occur. As described above, although one of the first cam part 421 or fourth cam part 424 of the first follower 242 first comes into contact with the other instrument, the first follower 242 may perform a designated motion (a straight-line motion in a direction (e.g., the Y axis direction in FIG. 2C) in which the bracket 210 is extended)) due to the bearing member 900. Likewise, one of a contact between the second cam part 422 of the second follower 243 and the second cam structure 412 and a contact between the third cam part 423 thereof and the third cam structure 413 may first occur. Although one of the second cam part 422 or third cam part 423 of the second follower 243 first comes into contact with the other instrument, the second follower 243 may perform a designated motion (a straight-line motion in a direction (e.g., the Y axis direction in FIG. 2C) in which the bracket 210 is extended) due to the bearing member 900.

A hinge apparatus according to various example embodiments may include: a bracket including a first coupling part formed in a first direction with respect to a middle of the bracket and a second coupling part formed in a second direction opposite to the first direction with respect to the middle of the bracket, a first body part including a first plate, a first rotation part coupled with the first plate fastened to the first coupling part of the bracket and configured to rotate about the bracket, and a first cam formed in the first rotation part, a second body part including a second plate, a second rotation part coupled with the second plate fastened to the second coupling part of the bracket and configured to rotate about the bracket, and a second cam formed in the second rotation part, and a torque provision unit, including a first follower including a first cam part engaged with the first cam and disposed in the bracket, a second follower including a second cam part engaged with the second cam and disposed in the bracket, and a pressurizing member disposed in the bracket between the first follower and the second follower and configured to provide an elastic force to the first follower and the second follower in opposite directions.

Furthermore, a part of a cross section of the first rotation part of the first body part may be formed in a circle, and the first cam structure may be formed in a part of the first rotation part. A part of a cross section of the second rotation part of the second body part may be formed in a circle, and the second cam structure may be formed in a part of the second rotation part.

Furthermore, the bracket may further include a third coupling part isolated from the second coupling part in the second direction with respect to the middle of the bracket and a fourth coupling part isolated from the first coupling part in the first direction with respect to the middle of the bracket. The first body part may further include a third rotation part coupled with the first plate fastened to the third coupling part of the bracket and configured to rotate about the bracket, and a third cam formed in the third rotation part. The second body part may further include a fourth rotation part coupled with the second plate fastened to the fourth coupling part of the bracket and configured to rotate about the bracket, and a fourth cam formed in the fourth rotation part.

Furthermore, a distance from the middle of the bracket to the first coupling part may be less than a distance from the middle to the fourth coupling part, and a distance from the middle of the bracket to the third coupling part may be greater than a distance from the middle of the bracket to the second coupling part.

Furthermore, the first follower of the torque provision unit may further include a fourth cam part engaged with the fourth cam. The second follower of the torque provision unit may further include a third cam part engaged with the third cam.

Furthermore, a rotation center of the first rotation part and a rotation center of the third rotation part may pass through a same straight line. A rotation center of the second rotation part and a rotation center of the fourth rotation part may pass through a same straight line.

Furthermore, when viewed in the first direction, parts of the first rotation part and the fourth rotation part may overlap and parts of the second rotation part and the third rotation part may overlap.

Furthermore, the bracket may further include a follower guide rail formed in a part where the first follower and the second follower come into contact with each other so that motions of the first follower and the second follower pressurized by the pressurizing member of the torque provision unit are guided.

Furthermore, the hinge apparatus may further include guide rails formed between the bracket and the first follower and between the bracket and the second follower, respectively, and a bearing member including balls accommodated in the guide rails.

An electronic device according to various example embodiments may include: a display, a first housing, a second housing, and a hinge rotatably connecting the first housing and the second housing. The hinge may include: a bracket including a first coupling part formed in a first direction with respect to a middle of the bracket and a second coupling part formed in a second direction opposite to the first direction with respect to the middle of the bracket, a first body part including a first plate, a first rotation part coupled with the first plate fastened to the first coupling part of the bracket and configured to rotate about the bracket, and a first cam formed in the first rotation part, a second body part including a second plate, a second rotation part coupled with the second plate fastened to the second coupling part of the bracket and configured to rotate about the bracket, and a second cam formed in the second rotation part, and a torque provision unit, including a first follower including a first cam part engaged with the first cam and disposed in the bracket, a second follower including a second cam part engaged with the second cam and disposed in the bracket, and a pressurizing member disposed in the bracket between the first follower and the second follower and configured to provide an elastic force to the first follower and the second follower in opposite directions.

Furthermore, a part of a cross section of the first rotation part of the first body part may be formed in a circle, and the first cam may be formed in a part of the first rotation part. A part of a cross section of the second rotation part of the second body part may be formed in a circle, and the second cam may be formed in a part of the second rotation part.

Furthermore, the bracket of the hinge may further include a third coupling part isolated from the second coupling part in the second direction with respect to the middle of the bracket and a fourth coupling part isolated from the first coupling part in the first direction with respect to the middle of the bracket. The first body part of the hinge may further include a third rotation part coupled with the first plate fastened to the third coupling part of the bracket and configured to rotate about the bracket, and a third cam formed in the third rotation part. The second body part of the hinge may further include a fourth rotation part coupled with the second plate fastened to the fourth coupling part of the bracket and configured to rotate about the bracket, and a fourth cam formed in the fourth rotation part.

Furthermore, in the hinge, a distance from the middle of the bracket to the first coupling part may be less than a distance from the middle of the bracket to the fourth coupling part, and a distance from the middle of the bracket to the third coupling part may be greater than a distance from the middle of the bracket to the second coupling part.

Furthermore, the first follower of the torque provision unit may further include a fourth cam part engaged with the fourth cam. The second follower of the torque provision unit may further include a third cam part engaged with the third cam.

Furthermore, in the hinge, a rotation center of the first rotation part and a rotation center of the third rotation part may pass through a same straight line, and a rotation center of the second rotation part and a rotation center of the fourth rotation part may pass through a same straight line.

Furthermore, in the hinge, when viewed in the first direction, parts of the first rotation part and the fourth rotation part may overlap and parts of the second rotation part and the third rotation part may overlap.

Furthermore, the bracket of the hinge may further include a follower guide rail formed in a part where the first follower and the second follower come into contact with each other so that motions of the first follower and the second follower provided with an elastic force by the pressurizing member of the torque provision unit are guided.

Furthermore, the hinge may further include guide rails formed between the bracket and the first follower and between the bracket and the second follower, respectively, and a bearing member including balls accommodated in the guide rails.

Furthermore, the hinge apparatus may further include a first arm rotatably installed in the bracket and connected to the first body part, a second arm rotatably installed in the bracket and connected to the second body part, and an interlocking member comprising a gear configured to interlock rotations of the first arm and the second arm.

Furthermore, the first arm of the hinge apparatus may be configured to be rotated about the bracket in a rotation axis different from a rotation axis of the first body part and may be connected to the first body part through a first pin inserted into a first compensation rail formed in the first body part in a length direction thereof. The second arm of the hinge may be configured to be rotated about the bracket in a rotation axis different from a rotation axis of the second body part and may be connected to the second body part through a second pin inserted into a second compensation rail formed in the second body part in a length direction thereof.

While the disclosure has been illustrated and described with reference to various example embodiments, it will be understood that the various example embodiments are intended to be illustrative, not limiting. Accordingly, all changes or modified forms derived based on the technical spirit of various embodiments disclosed herein should be understood as being included in the scope of disclosure. It will also be understood that any of the embodiment(s) described herein may be used in conjunction with any other embodiment(s) described herein.

What is claimed is:

1. An electronic device comprising:
   a display;
   a first housing;
   a second housing; and
   a hinge apparatus rotatably connecting the first housing and the second housing,
   wherein the hinge apparatus comprises:
   a bracket comprising a first coupling part formed in a first direction with respect to a middle of the bracket, a second coupling part formed in a second direction opposite to the first direction with respect to the middle of the bracket, a third coupling part isolated from the second coupling part in the second direction with respect to the middle of the bracket, and a fourth coupling part isolated from the first coupling part in the first direction with respect to the middle of the bracket;
   a first body part comprising a first plate, a first rotation part coupled with the first plate fastened to the first coupling part of the bracket and configured to rotate about the bracket, a third rotation part coupled with the first plate fastened to the third coupling part of the bracket and configured to rotate about the bracket, a first cam formed in the first rotation part, and a third cam formed in the third rotation part;
   a second body part comprising a second plate, a second rotation part coupled with the second plate fastened to the second coupling part of the bracket and configured to rotate about the bracket, a fourth rotation part coupled with the second plate fastened to the fourth coupling part of the bracket and configured to rotate about the bracket, a second cam formed in the second rotation part, and a fourth cam formed in the fourth rotation part; and
   a torque provision unit, comprising a first follower comprising a first cam part engaged with the first cam and disposed in the bracket, a second follower comprising a second cam part engaged with the second cam and disposed in the bracket, and a pressurizing part disposed in the bracket between the first follower and the second follower and configured to provide an elastic force to the first follower and the second follower in opposite directions.

2. The electronic device of claim 1, wherein:
   a part of a cross section of the first rotation part of the first body part is formed in a partial circle, and the first cam is formed in a part of the first rotation part, and
   a part of a cross section of the second rotation part of the second body part is formed in a partial circle, and the second cam is formed in a part of the second rotation part.

3. The electronic device of claim 1, wherein in the hinge apparatus,
   a distance from the middle of the bracket to the first coupling part is greater than a distance from the middle of the bracket to the fourth coupling part, and
   a distance from the middle of the bracket to the third coupling part is less than a distance from the middle of the bracket to the second coupling part.

4. The electronic device of claim 1, wherein:
   the first follower of the torque provision unit further comprises a fourth cam part engaged with the fourth cam, and
   the second follower of the torque provision unit further comprises a third cam part engaged with the third cam.

5. The electronic device of claim 1, wherein in the hinge apparatus,
   a rotation center of the first rotation part and a rotation center of the third rotation part pass through an identical straight line, and
   a rotation center of the second rotation part and a rotation center of the fourth rotation part pass through an identical straight line.

6. The electronic device of claim 1, wherein the hinge apparatus further comprises:
   a first arm rotatably installed in the bracket and connected to the first body part,
   a second arm rotatably installed in the bracket and connected to the second body part; and
   an interlocking member comprising a gear configured to interlock rotations of the first arm and the second arm.

7. The electronic device of claim 6, wherein:
   the first arm of the hinge apparatus is configured to be rotated about the bracket in a rotation axis different from a rotation axis of the first body part and is connected to the first body part through a first pin inserted into a first compensation rail formed in the first body part in a length direction thereof, and
   the second arm of the hinge apparatus is configured to be rotated about the bracket in a rotation axis different from a rotation axis of the second body part and is connected to the second body part through a second pin inserted into a second compensation rail formed in the second body part in a length direction thereof.

* * * * *